United States Patent
Tatsumura et al.

(10) Patent No.: US 8,842,475 B2
(45) Date of Patent: Sep. 23, 2014

(54) CONFIGURATION MEMORY

(75) Inventors: Kosuke Tatsumura, Kawasaki (JP); Masato Oda, Yokohama (JP); Koichiro Zaitsu, Kawasaki (JP); Atsushi Kawasumi, Kawasaki (JP); Mari Matsumoto, Yokohama (JP); Shinichi Yasuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 72 days.

(21) Appl. No.: 13/603,666

(22) Filed: Sep. 5, 2012

(65) Prior Publication Data

US 2013/0258782 A1  Oct. 3, 2013

(30) Foreign Application Priority Data

Mar. 28, 2012 (JP) ................................. 2012-075146

(51) Int. Cl.
*G11C 11/34* (2006.01)

(52) U.S. Cl.
USPC ............ 365/185.17; 365/185.05; 365/185.06; 365/185.11; 365/185.21; 365/185.23; 365/49.11; 365/154; 365/205

(58) Field of Classification Search
CPC ............ H01L 27/115; H01L 27/11521; H01L 29/7883; H01L 27/11; H01L 27/1104; G11C 16/10; G11C 16/0416; G11C 16/0483; G11C 16/0433; G11C 16/16; G11C 16/08; G11C 16/26; G11C 16/3418; G11C 16/28; G11C 11/5642; G11C 7/062; G11C 8/08; G11C 16/30; G11C 16/12; G11C 15/04; G11C 15/00; G11C 15/046; G11C 15/043; G11C 17/30982; G11C 11/412; G11C 11/413; G11C 11/419; G11C 11/4091; G11C 7/065; G11C 7/06; G11C 11/4097; G11C 7/12
USPC ............ 365/185.05, 185.06, 185.11, 185.17, 365/185.21, 185.23, 49.11, 154, 205
See application file for complete search history.

(56) References Cited

U.S. PATENT DOCUMENTS

| 7,193,437 | B2 | 3/2007 | Cappelli et al. |
| 7,804,730 | B2 | 9/2010 | Redgrave et al. |
| 8,218,390 | B2 * | 7/2012 | Nii et al. ........................ 365/226 |
| 2011/0199829 | A1 * | 8/2011 | Lee et al. .................. 365/185.17 |
| 2012/0008389 | A1 * | 1/2012 | Kim .......................... 365/185.03 |
| 2012/0063211 | A1 * | 3/2012 | Sharma et al. ................. 365/154 |

FOREIGN PATENT DOCUMENTS

| JP | 02-003194 | 1/1990 |
| JP | 11-345496 | 12/1999 |
| JP | 2013-171593 | 9/2013 |

OTHER PUBLICATIONS

Matsumoto et al., U.S. Appl. No. 13/772,484, filed Feb. 21, 2013.
Hariyama, M. et al., "Novel Switch Block Architecture Using Non-Volatile Functional Pass-gate for Multi-Context FPGAs," Proceedings of the IEEE Computer Society Annual Symposium on VLSI, New Frontiers in VLSI Design, 5 sheets, (2005).
First Office Action issued by Japanese Patent Office in Japanese Application No. JP 2012-075146 on May 20, 2014, 5 pgs (including translation).

* cited by examiner

*Primary Examiner* — Fernando Hidalgo

(74) *Attorney, Agent, or Firm* — Finnegan, Henderson, Farabow, Garrett & Dunner, LLP

(57) ABSTRACT

According to one embodiment, a configuration memory includes first and second data lines, a first memory string which comprises at least first and second nonvolatile memory transistors which are connected in series between a common node and the first data line, a second memory string which comprises at least third and fourth nonvolatile memory transistors which are connected in series between the common node and the second data line, and a flip-flop circuit which comprises a first data holding node connected to the common node and a second data holding node connected to a configuration data output node.

19 Claims, 28 Drawing Sheets

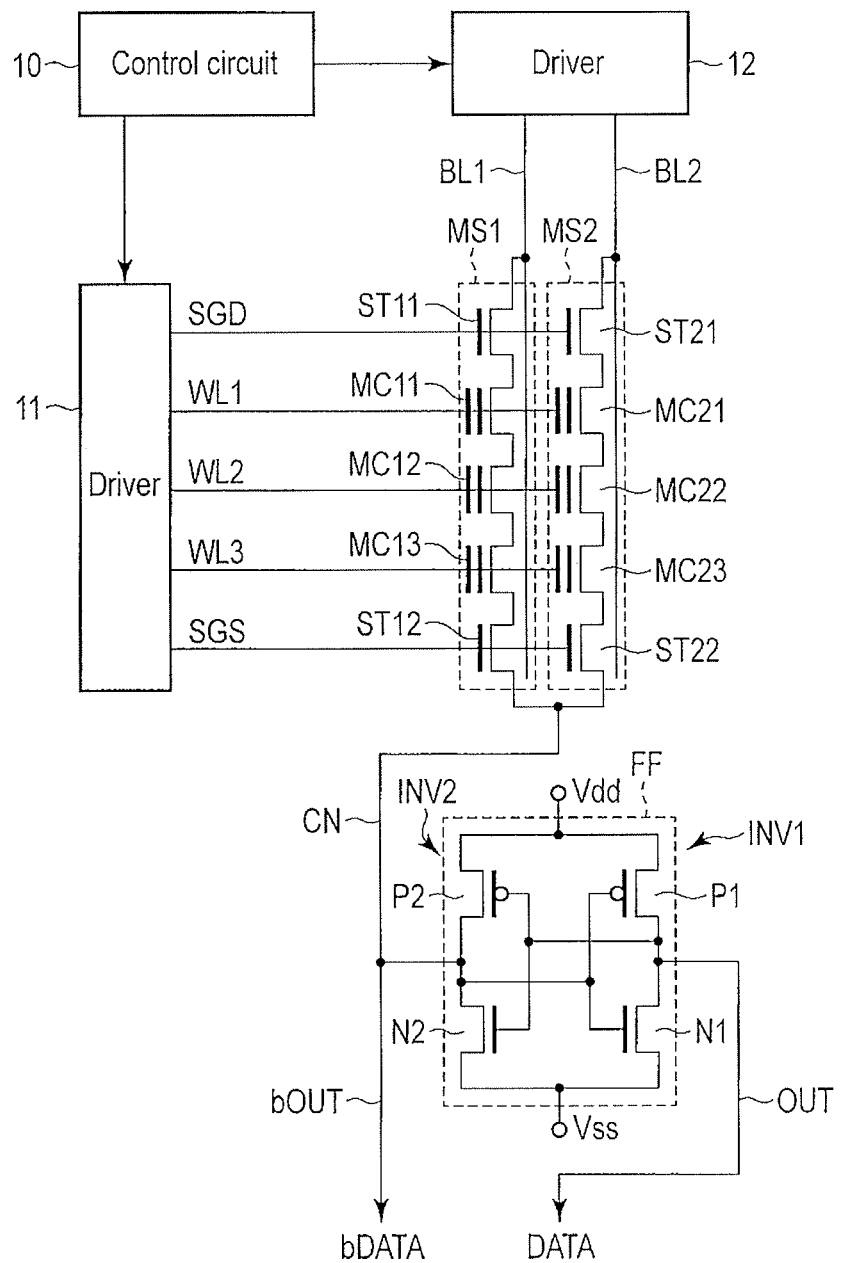
F I G. 1

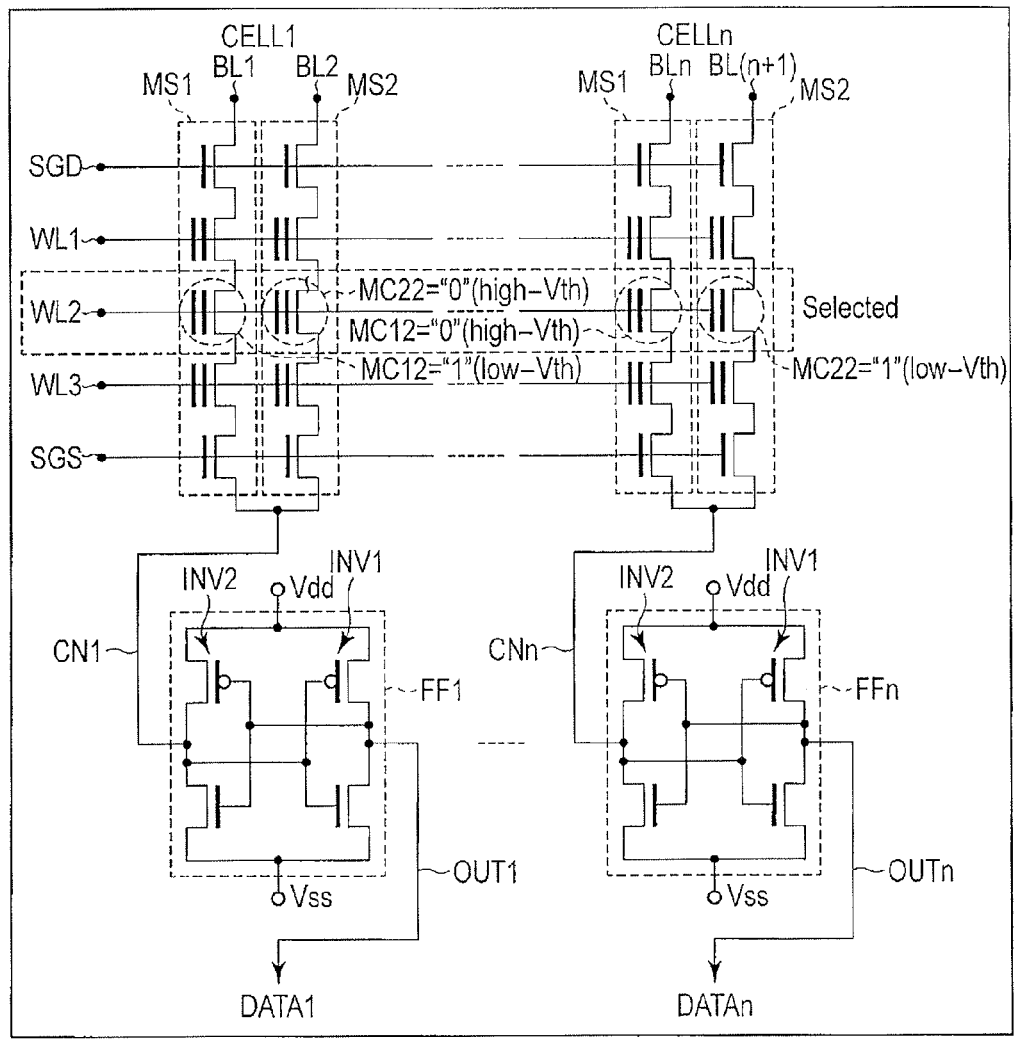
F I G. 2

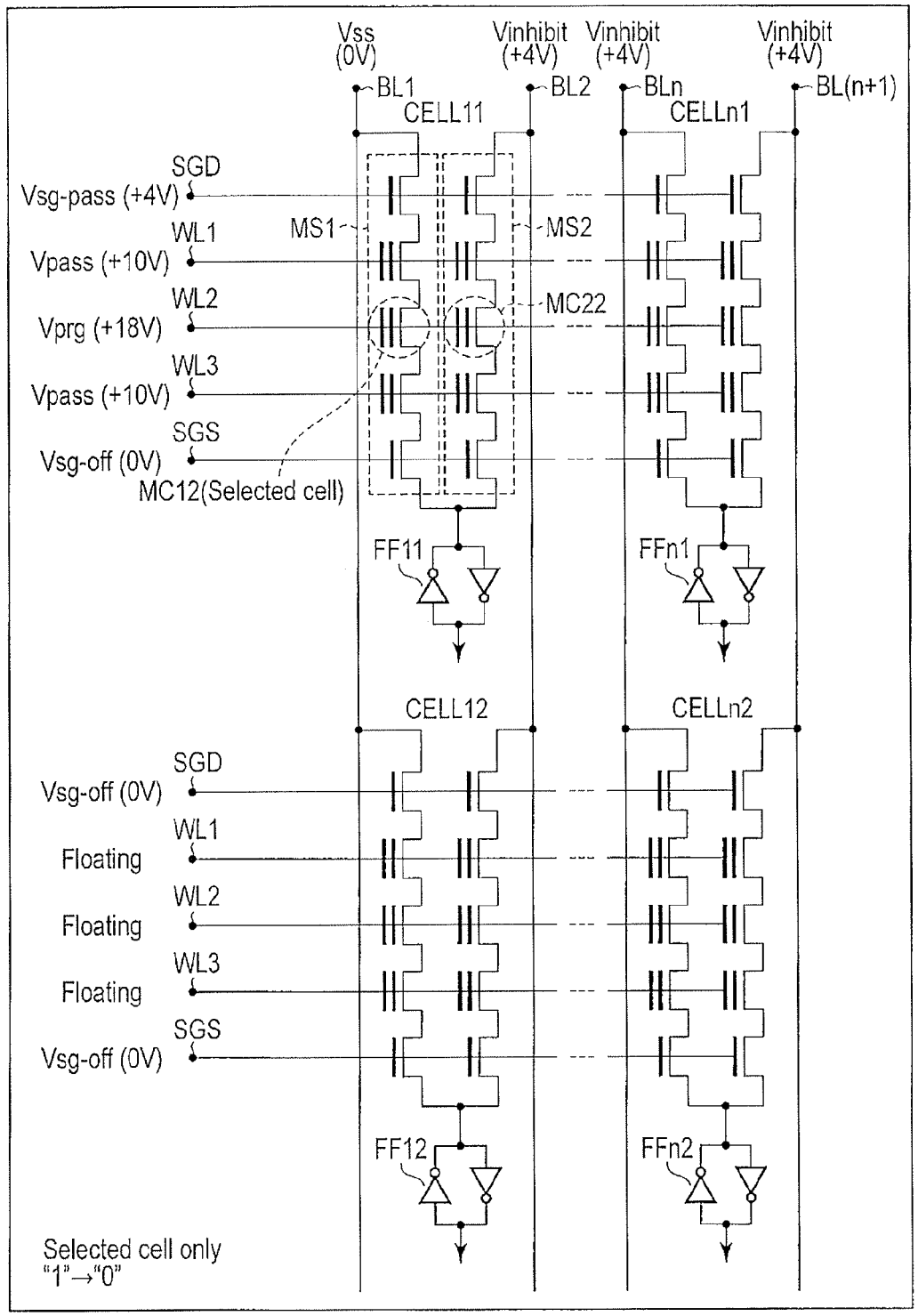
F I G. 4

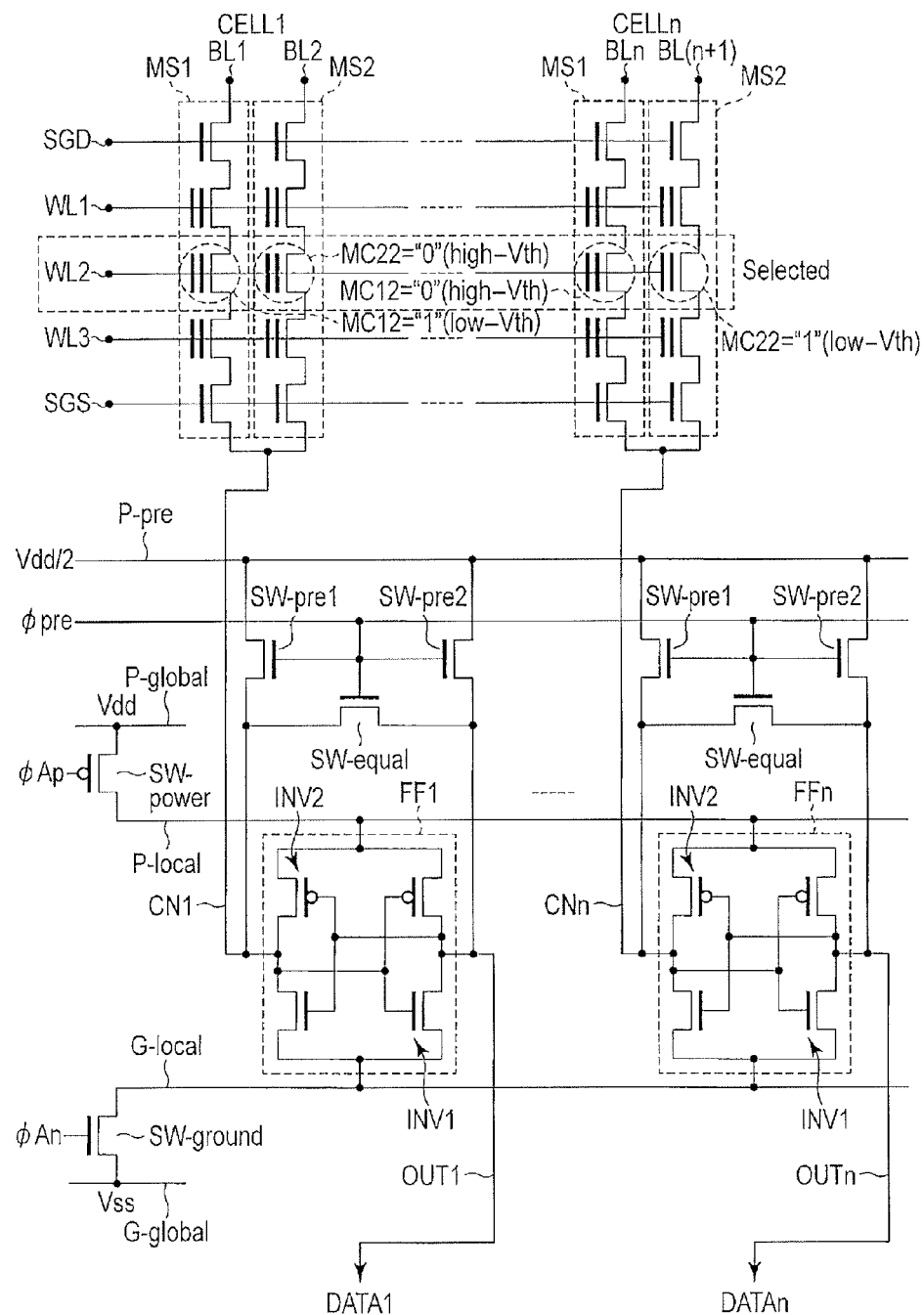
F I G. 6

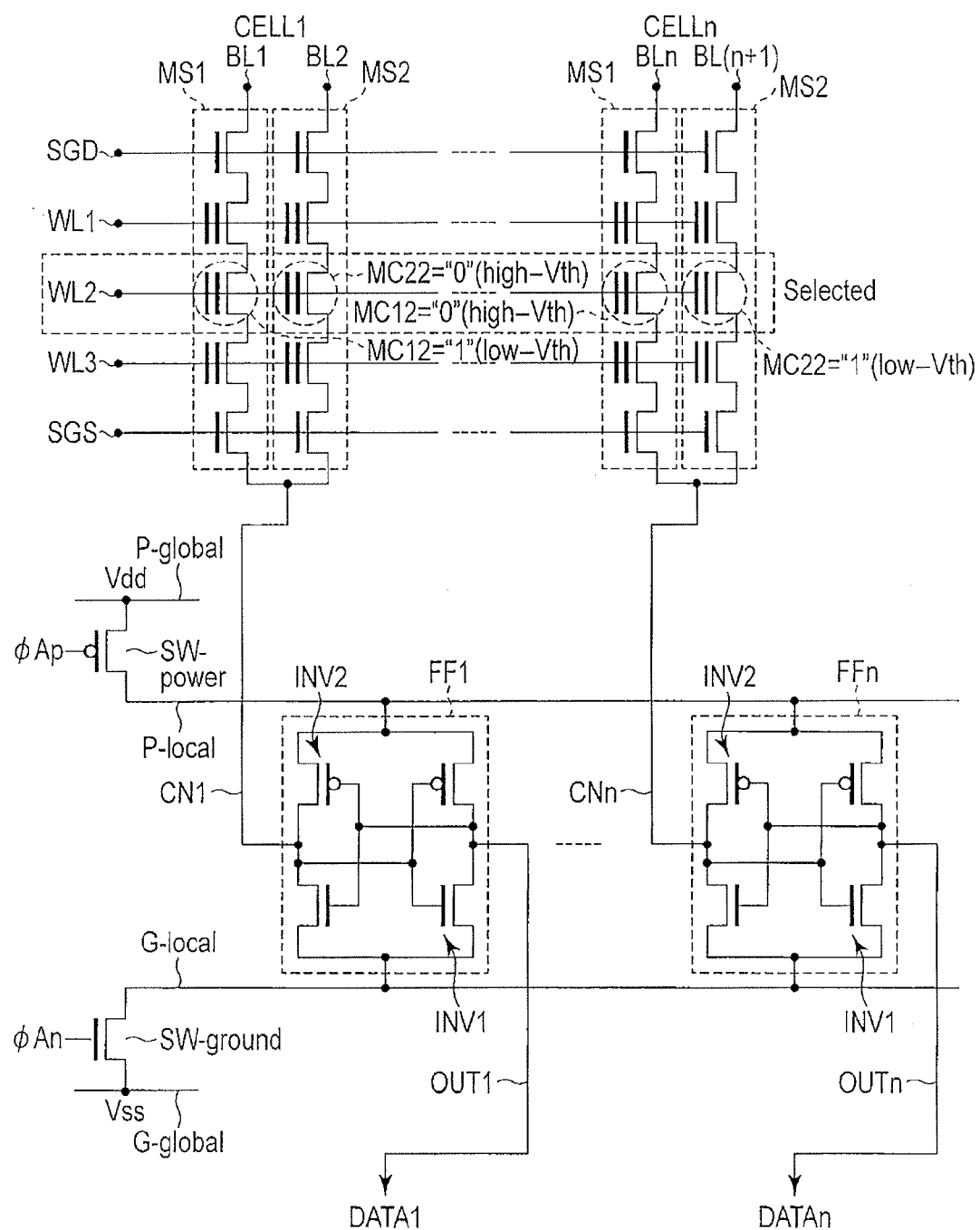
F I G. 8

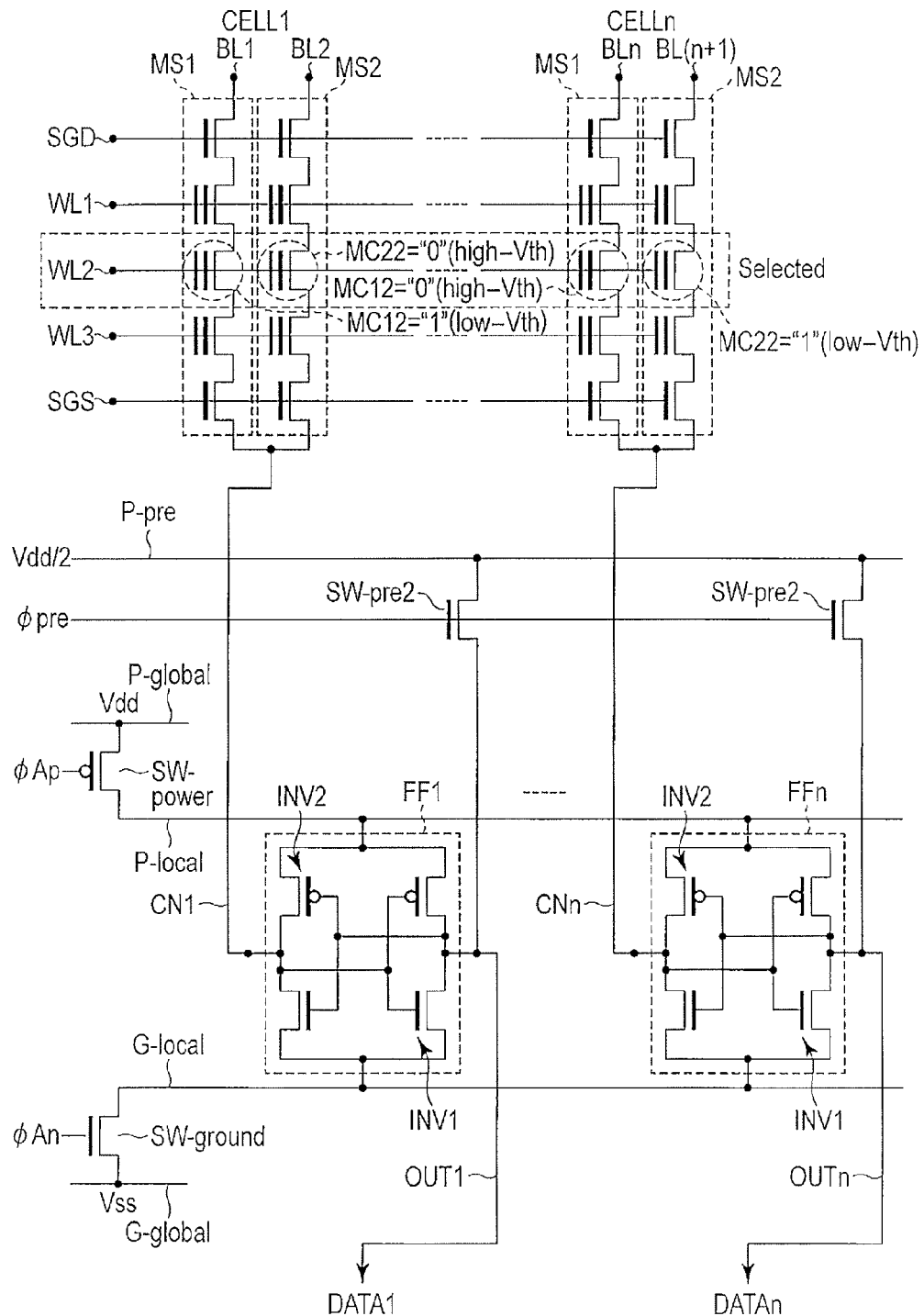
F I G. 10

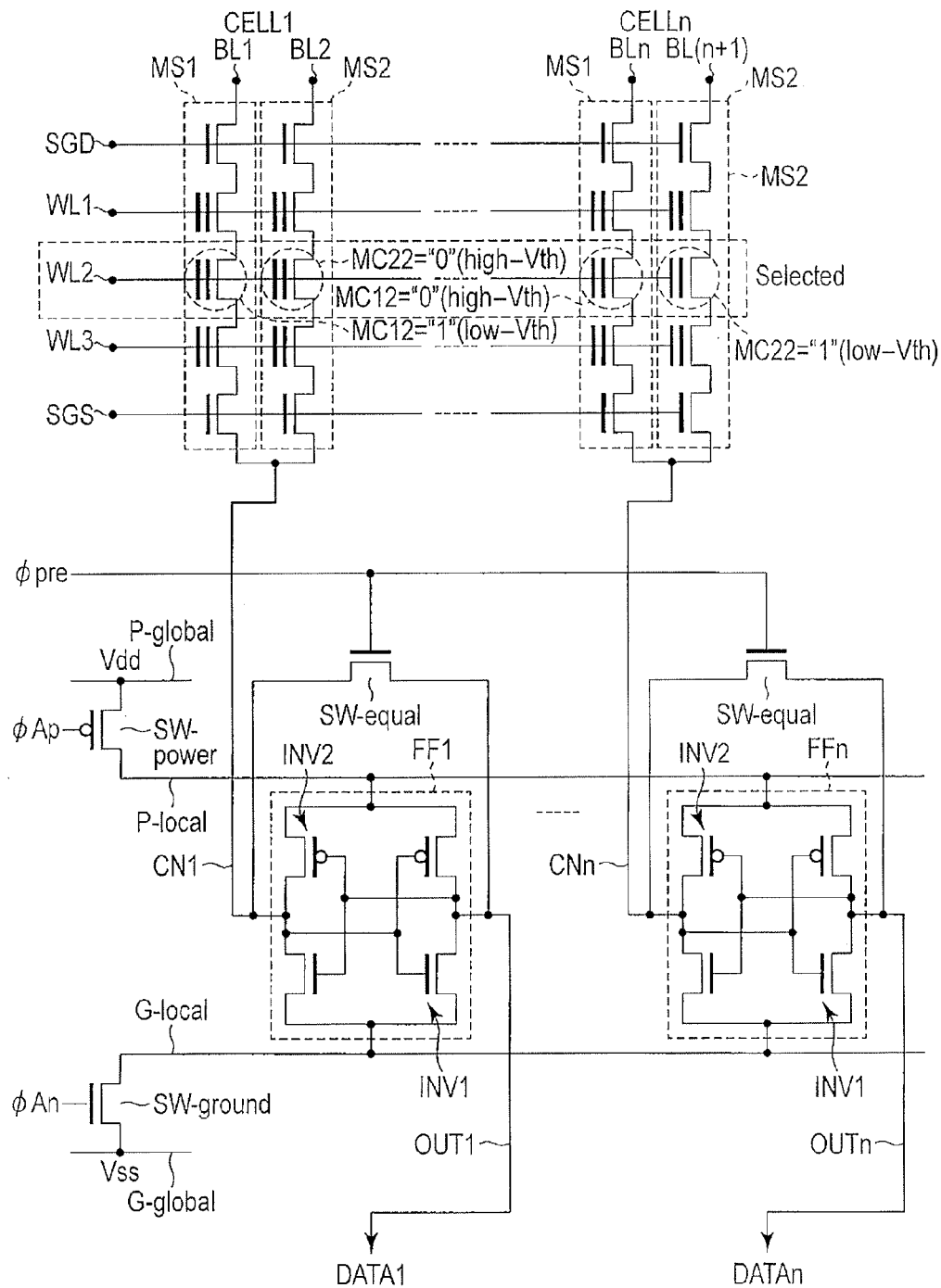
F I G. 12

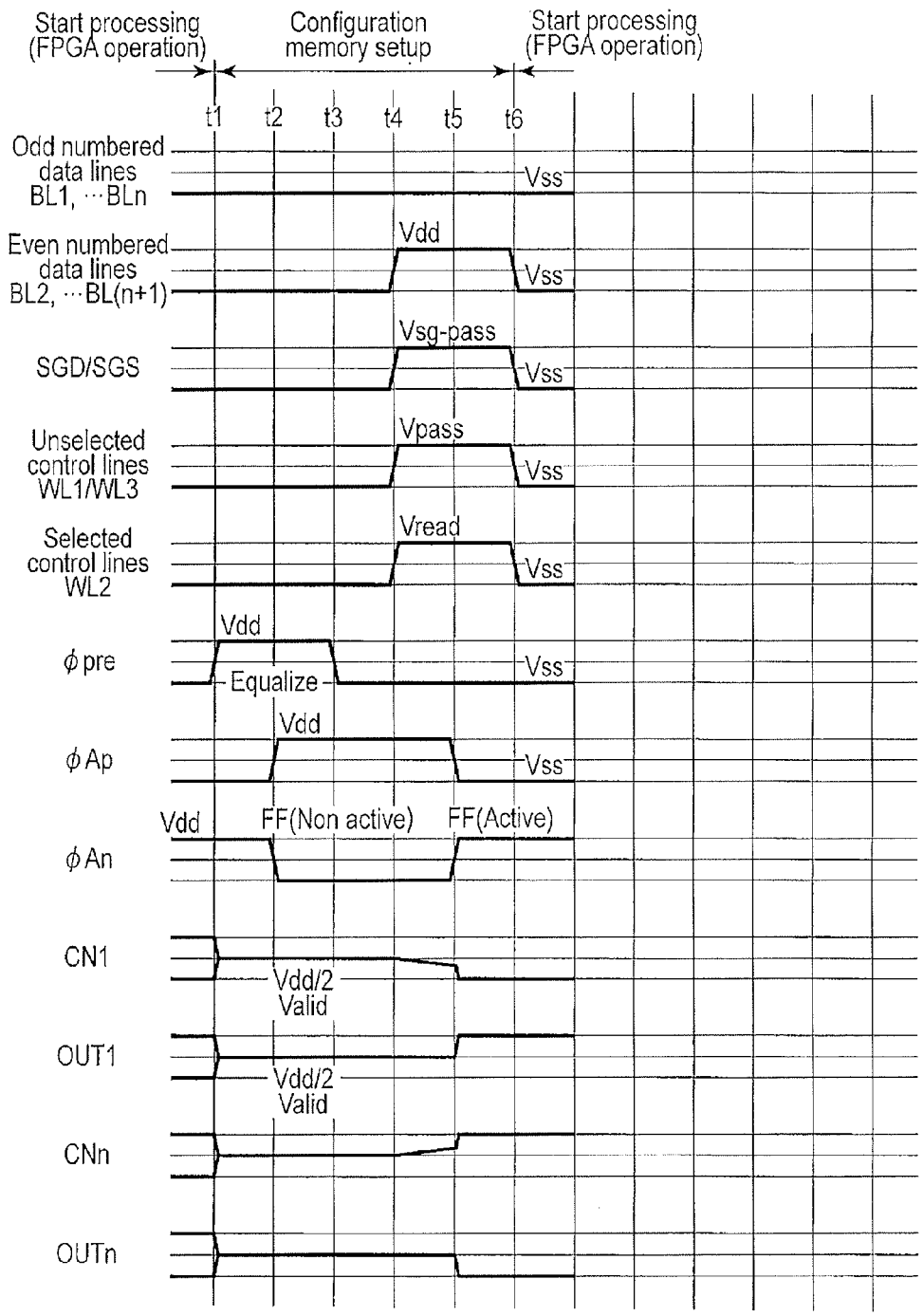
F I G. 13

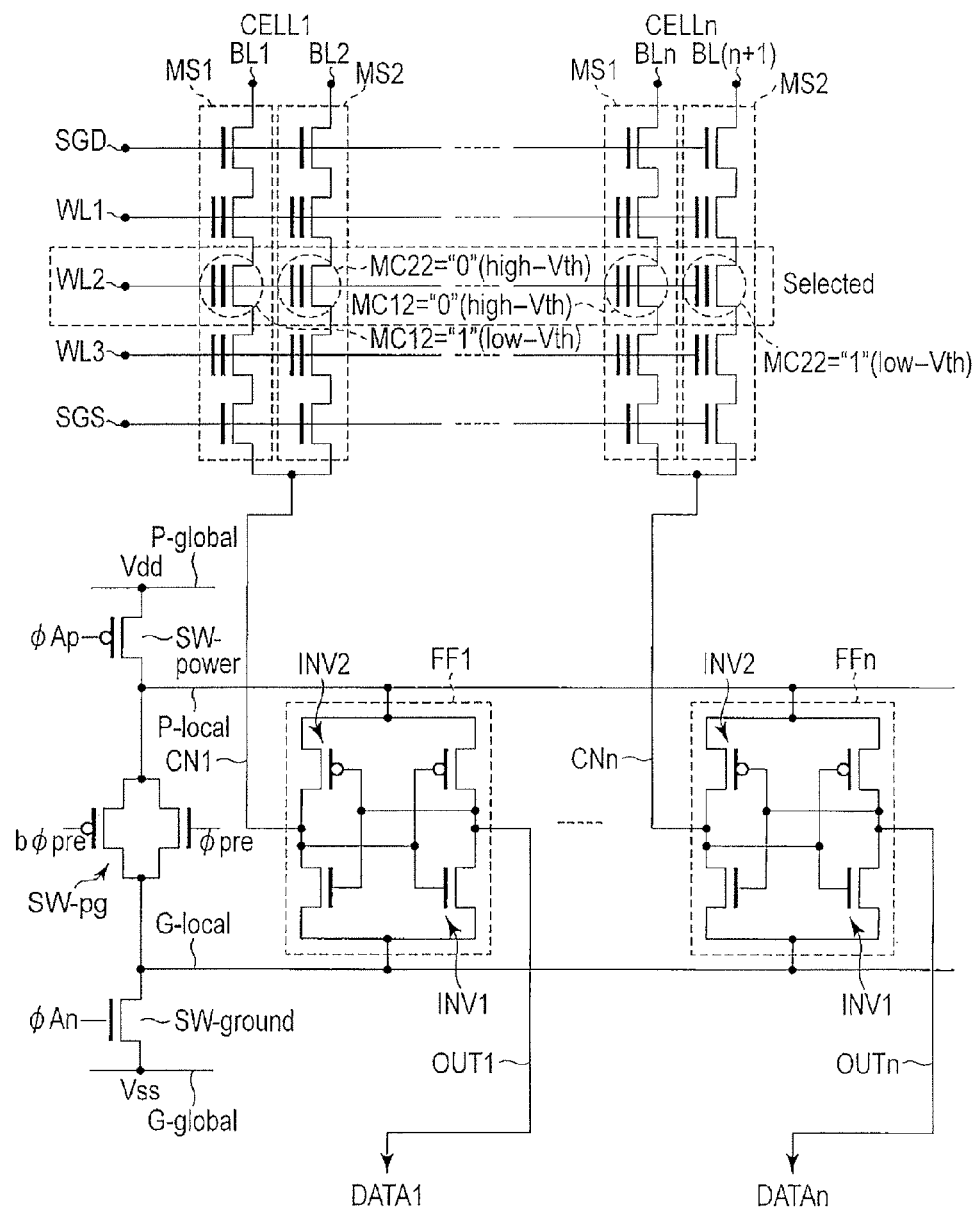
F I G. 14

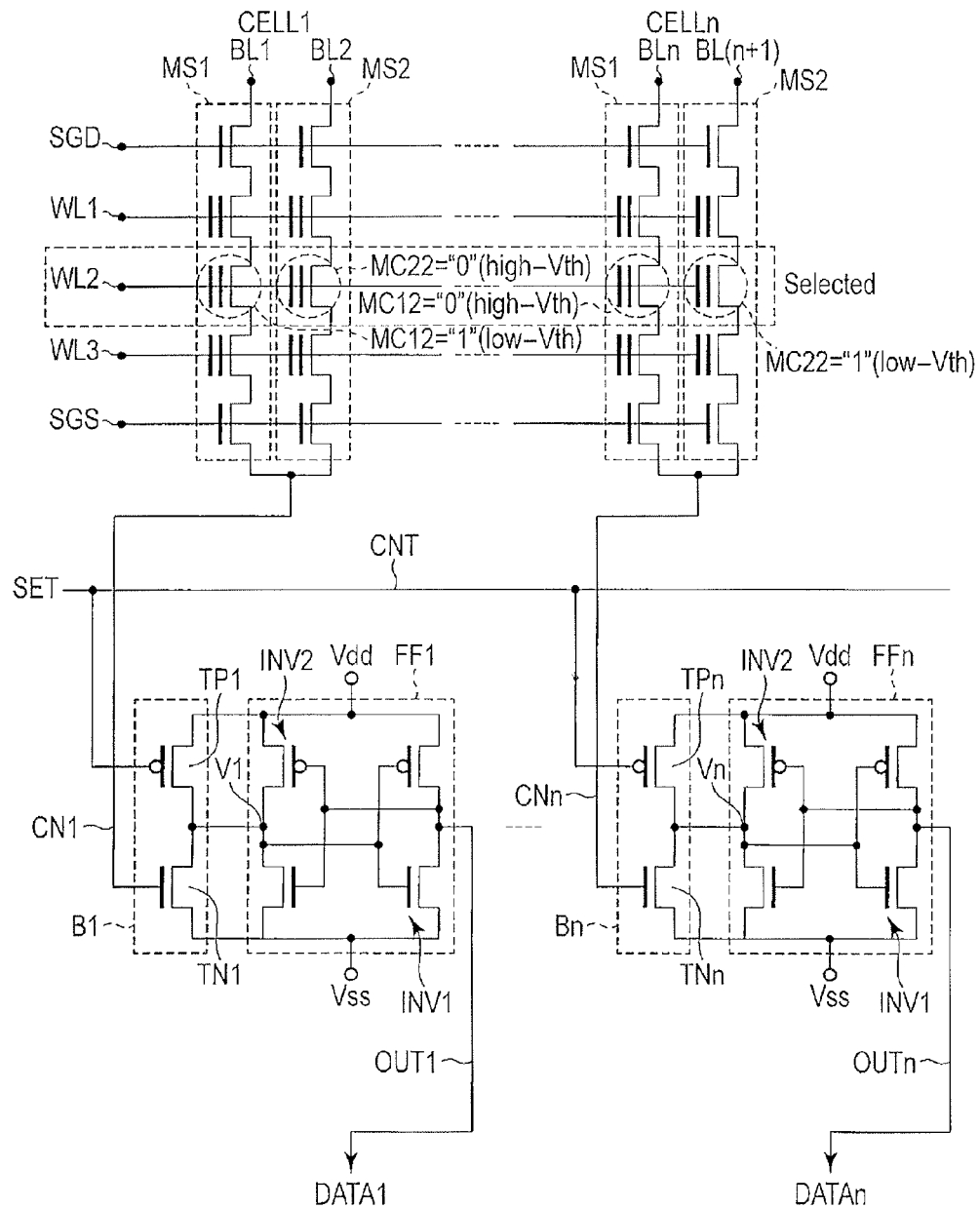
F I G. 18

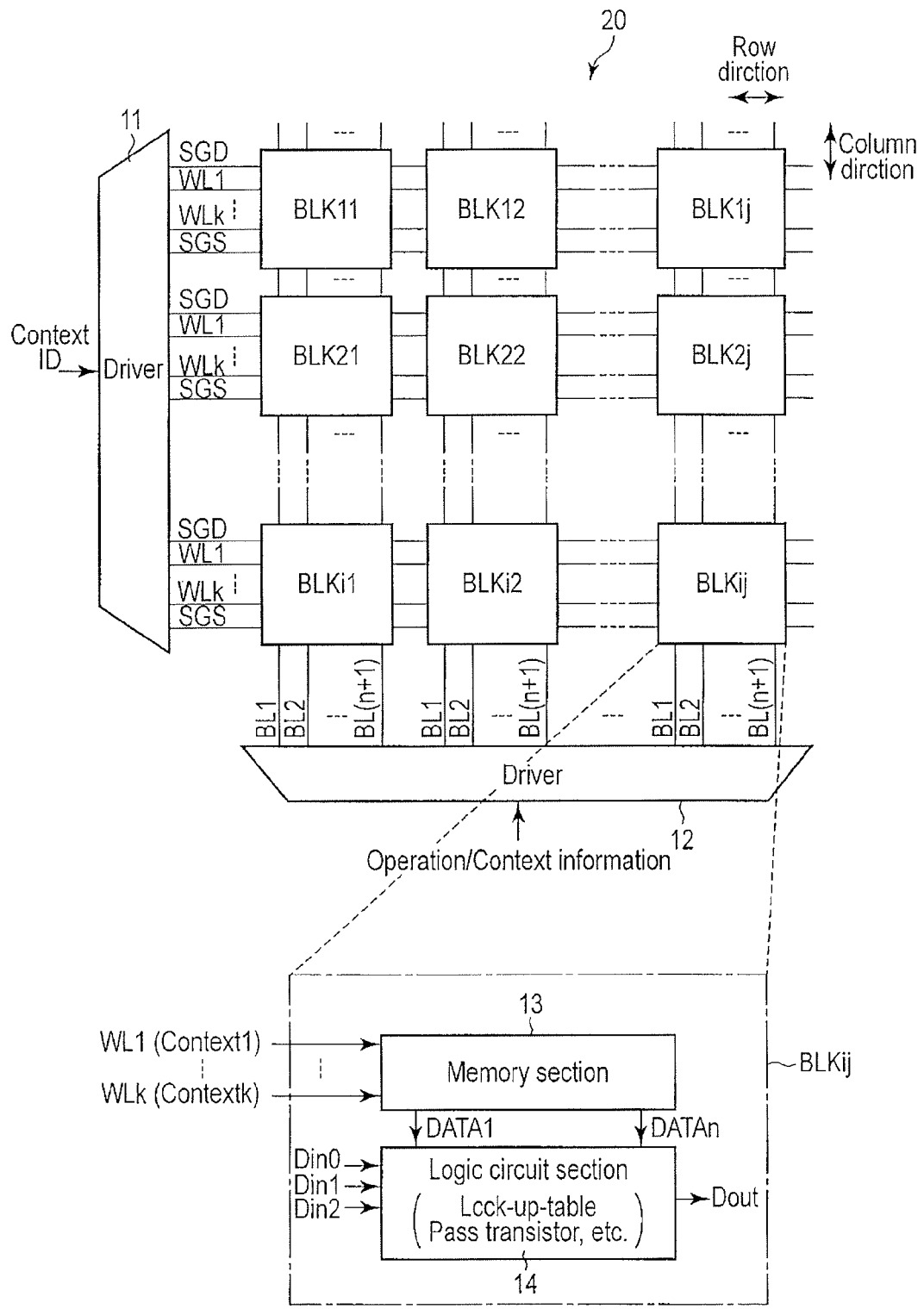
F I G. 20

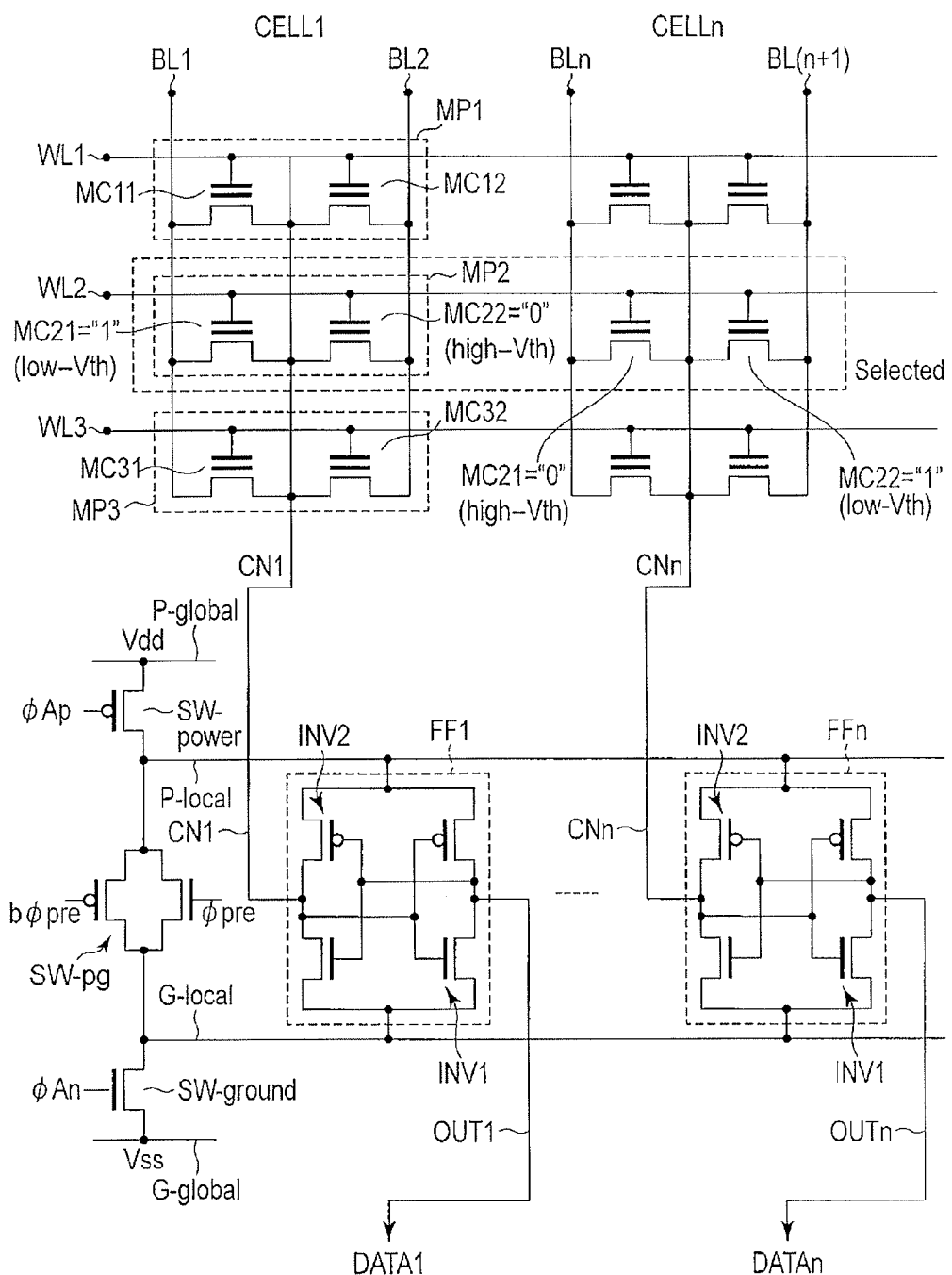
F I G. 25

CONFIGURATION MEMORY

CROSS-REFERENCE TO RELATED APPLICATIONS

This application is based upon and claims the benefit of priority from Japanese Patent Application No. 2012-075146, filed Mar. 28, 2012, the entire contents of which are incorporated herein by reference.

FIELD

Embodiments described herein relate generally to a configuration memory.

BACKGROUND

Reconfigurable logic circuits such as a field Programmable gate array (FPGA) achieve a predetermined logic (circuit configuration) based on data stored in a configuration memory.

In this case, configuration data for achieving the logic are referred to as a context. In recent years, as the increase in diversity of systems, multi-context reconfigurable logic circuits capable of storing a plurality of contexts and selectively achieving one of a plurality of logics have been suggested.

The multi-context reconfigurable logic circuit includes a plurality of contexts in a configuration memory having a plurality of memory devices. During operation of the logic circuit, contexts are preferably switched at a high speed.

However, in most cases, a logic circuit capable of switching contexts at a high speed is configured such that the configuration memory is made of SRAM (Static Random Access Memory). In this case, the area size of the SRAM is large, and therefore, as the number of contexts increases, there is a problem in that the configuration memory cannot be accommodated within a predetermined area in a chip.

Moreover, since the SRAM is volatile, contexts stored in the configuration memory are lost when the power is turned off. Therefore, there is a problem in that the SRAM based device cannot utilize a technique for turning off the power in the standby state in order to reduce power consumption. On the other hand, when the configuration memory is constituted by a nonvolatile memory device, there is a problem in that false writing is caused by a voltage continuously applied to the nonvolatile memory device during operation of the logic circuit (read disturb).

BRIEF DESCRIPTION OF THE DRAWINGS

FIG. 1 is a circuit diagram illustrating a basic unit;
FIG. 2 is a circuit diagram illustrating a state of read operation;
FIG. 4 is a circuit diagram illustrating a state of write operation;
FIG. 6 is a circuit diagram illustrating a first modification;
FIG. 8 is a circuit diagram illustrating a second modification;
FIG. 10 is a circuit diagram illustrating a third modification;
FIG. 12 is a circuit diagram illustrating a fourth modification;
FIG. 13 is a waveform chart illustrating read operation of the circuit of FIG. 12;
FIG. 14 is a circuit diagram illustrating a fifth modification;
FIG. 18 is a circuit diagram illustrating a seventh modification;
FIG. 20 is a circuit diagram illustrating FPGA as an example of application;
FIG. 25 is a figure illustrating a modification of a memory array.

DETAILED DESCRIPTION

Figure 3:
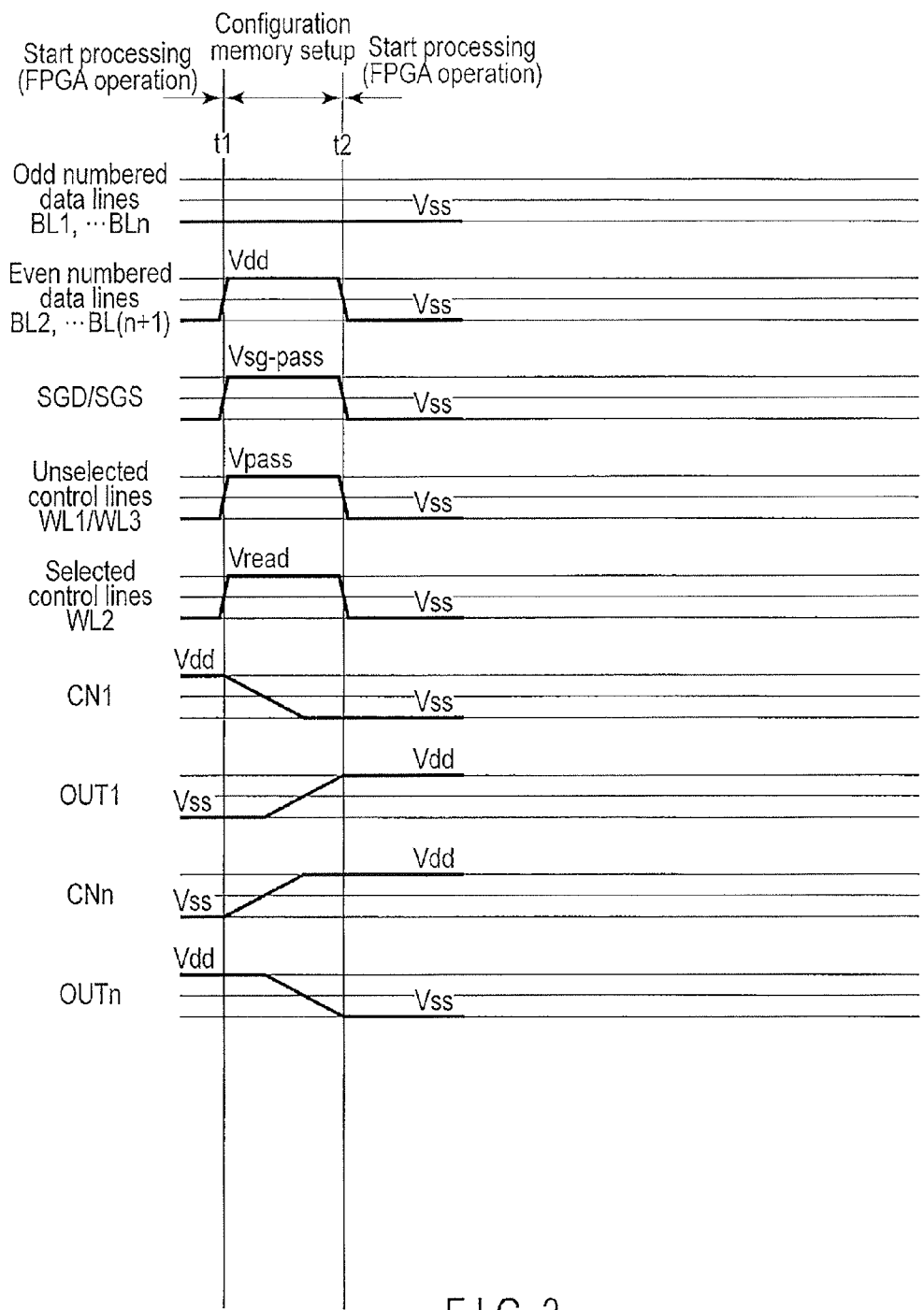
FIG. 3 is a waveform chart illustrating read operation of the circuit of FIG. 2.

In general, according to one embodiment, a configuration memory comprises: first and second data lines; a first memory string which comprises at least first and second nonvolatile memory transistors which are connected in series between a common node and the first data line; a second memory string which comprises at least third and fourth nonvolatile memory transistors which are connected in series between the common node and the second data line; and a flip-flop circuit which comprises a first data holding node connected to the common node and a second data holding node connected to a configuration data output node.

Hereinafter, embodiments will be explained with reference to drawings.

(Basic Unit)

FIG. 1 illustrates a configuration memory.

FIG. 1 illustrates a basic unit for storing a plurality of contexts, which is provided in a multi-context reconfigurable logic circuit.

For example, a first memory string MS1 is a NAND string including first, second, and third nonvolatile memory devices MC11, MC12, MC13, which are connected in series between a common node CN and a first data line (bit line) BL1.

One end of the first, second, and third nonvolatile memory devices MC11, MC12, MC13 is connected via a drain-side select gate transistor ST11 to the first data line BL1. The other end of the first, second, and third nonvolatile memory devices MC11, MC12, MC13 is connected via a source side select gate transistor ST12 to the common node CN.

Likewise, for example, a second memory string MS2 is a NAND string including first, second, and third nonvolatile memory devices MC21, MC22, MC23, which are connected in series between the common node CN and a second data line (bit line) BL2.

One end of the first, second, and third nonvolatile memory devices MC21, MC22, MC23 is connected via a drain-side select gate transistor ST21 to the second data line BL2. The other end of the first, second, and third nonvolatile memory devices MC21, MC22, MC23 is connected via a source side select gate transistor ST22 to the common node CN.

The first control line (word line) WL1 is connected to control terminals of the first nonvolatile memory devices MC11, MC21 in the first and second memory strings MS1, MS2.

Likewise, the second control line (word line) WL2 is connected to control terminals of the second nonvolatile memory devices MC12, MC22 in the first and second memory strings MS1, MS2. The third control line (word line) WL3 is connected to control terminals of the third nonvolatile memory devices MC13, MC23 in the first and second memory strings MS1, MS2.

The first nonvolatile memory devices MC11, MC21 constitute one memory pair and store 1 bit (complementary data). Likewise, the second nonvolatile memory devices MC12, MC22 constitute one memory pair and store 1 bit (complementary data), and the third nonvolatile memory devices MC13, MC23 constitute one memory pair and store 1 bit (complementary data).

In this example, one context is constituted by one memory pair (1 bit) including two nonvolatile memory devices MC1$i$, MC2$i$ connected to one control line WL$i$ ($i$ is any one of 1 to 3). However, by combining a plurality of basic units of this example, one context can be easily constituted by a plurality of bits.

In this example, the number of contexts is three (corresponding to the number of memory pairs), but the number of contexts is not limited thereto. More specifically, when the number of memory pairs (in this example, the number of control lines WL$i$) is two or more, this basic unit may be used as the configuration memory of the multi-context reconfigurable logic circuit.

Further, in this example, one control line WL$i$ is commonly connected to the control terminals of the two nonvolatile memory devices MC1$i$, MC2$i$ constituting one memory pair. Alternatively, one control line may be independently connected to each of the control terminals of the two nonvolatile memory devices MC1$i$, MC2$i$ constituting one memory pair (i.e., totally two control lines are connected to the control terminals of the two nonvolatile memory devices MC1$i$, MC2$i$ constituting one memory pair).

Each of the first, second, and third nonvolatile memory devices MC11, MC12, MC13 in the first memory string MS1 and the first, second, and third nonvolatile memory devices MC21, MC22, MC23 in the second memory string MS2 is, for example, a flash memory cell.

For example, the flash memory cell is an FET (Field Effect Transistor) having a laminated structure including a semiconductor layer (channel), a first insulating layer (tunnel insulating layer), a charge accumulating layer, a second insulating layer (inter-electrode insulating layer/block insulating layer), and a control gate electrode (word line).

When the charge accumulating layer is a polysilicon gate electrode in an electrically floating state, the flash memory cell is called a floating gate-type, and the second insulating layer is called an inter-electrode insulating layer, an IPD (Inter-polysilicon dielectric), and the like.

When the charge accumulating layer is an insulating layer having a function of trapping charges (for example, silicon nitride layer), the flash memory cell is called charge trap type, an SONOS (Silicon-Oxide-Nitride-Oxide-Silicon) type, and the like, and the second insulating layer is called a block insulating layer for blocking a leak current.

The select gate transistors ST11, ST12, ST21, ST22 may have the same structure as the first, second, and third nonvolatile memory devices MC11, MC12, MC13, MC21, MC22, MC23, or may have a structure different from the first, second, and third nonvolatile memory devices MC11, MC12, MC13, MC21, MC22, MC23. In the latter case, for example, the select gate transistors ST11, ST12, ST21, ST22 are preferably MOS (Metal-Oxide-Silicon) type FETs not having any charge accumulating layer.

For example, control terminals of the select gate transistors ST11, ST21 at the drain-side are connected to a select gate line SGD. For example, control terminals of the select gate transistors ST12, ST22 at the source side are connected to a select gate line SGS.

In this case, the first, second, and third control lines WL1, WL2, WL3 and the select gate lines SGD, SGS extend in a first direction (row direction), and the first and second data lines BL1, BL2 extend in a second direction (column direction) perpendicular to the first direction.

The first and second memory strings MS1, MS2 may be arranged in a two-dimensional manner in the first and second directions, or may be arranged in a three-dimensional manner in a third direction (vertical direction) perpendicular to the first and second directions.

A flip-flop circuit FF is connected between the common node CN and a configuration data output node OUT. For example, the flip-flop circuit FF includes first and second inverters INV1, INV2 which are connected in a cross-coupled manner.

The inverter INV1 includes a P-channel FET P1 and an N-channel FET N1 which are connected in series between a power supply node Vdd and a ground node Vss. The inverter INV2 includes a P-channel FET P2 and an N-channel FET N2 which are connected in series between the power supply node Vdd and the ground node Vss.

The input terminal of the inverter INV1 is connected to the common node CN, and the output terminal of the inverter INV1 is connected to the configuration data output node OUT. The input terminal of the inverter INV2 is connected to the configuration data output node OUT, and the output terminal of the inverter INV2 is connected to the common node CN.

For example, the configuration data output node OUT is connected to a control terminal of a pass transistor (for example, a gate terminal of an FET). The pass transistor has a role of selectively connecting, with each other, logic elements for achieving predetermined logic (circuit configuration). In some cases, one output node OUT may be connected to the gate terminals of multiple pass transistors.

A driver 11 drives the first, second, and third control lines WL1, WL2, WL3 and the select gate lines SGD, SGS. A driver 12 drives the first and second data lines BL1, BL2.

A control circuit 10 controls operation of the configuration memory (basic unit) of this example.

For example, during reading, the first data line BL1 is set at a first potential (for example, ground potential Vss), and the second data line BL2 is set at a second potential (for example, power supply potential Vdd). In this specification, "reading" means data transfer from the nonvolatile memory device to the flip-flop circuit.

When a context stored in two nonvolatile memory devices (1 memory pair) connected to the first control line WL1 (selected context) is read, the first control line WL1 is set at a read potential Vread between a threshold value of the first nonvolatile memory device MC11 in the first memory string MS1 and a threshold value of the first nonvolatile memory device MC21 in the second memory string MS2.

As a result, based on the complementary data stored in the first nonvolatile memory devices MC11, MC21, the selected context (one of the first and second potentials) is transferred to the flip-flop circuit FF. The selected context is latched in the flip-flop circuit FF.

When the configuration data output node OUT is a second potential (for example, power supply potential Vdd), for example, the pass transistor becomes the ON state, so that two logic elements connected at both ends of the pass transistor are connected with each other.

On the other hand, when the configuration data output node OUT is a first potential (for example, ground potential), for example, the pass transistor becomes the OFF state, so that two logic elements connected to both ends of the pass transistor are divided from each other.

In a Look-Up-Table (LUT) circuit, the configuration data output terminal OUT is connected to an input terminal (source/drain) of a switch transistor. In the LUT circuit, the configuration data output terminal OUT may be connected to the input of the inverter, and the output of the inverter may be connected to the input terminal (source/drain) of the switch transistor.

An inverse configuration data output node bOUT may be additionally provided to the common node CN. The inverse configuration data output node bOUT outputs an inverse data which are obtained by inverting the data which are output from the configuration data output node OUT.

(Basic Operation)

Basic operation (read/write/erase) will be explained when an array structure is structured by combining a plurality of basic units of FIG. 1.

1. Read Operation

FIG. 2 illustrates a state of the basic units during read operation. FIG. 3 is a waveform chart illustrating read operation.

The selected context has (n+1)/2 bits stored in (n+1) nonvolatile memory devices ((n+1)/2 memory pairs) connected to the second control line WL2. In this case, n is an odd number.

In this case, a first cell unit CELL1 includes first and second memory strings MS1, MS2 which are connected to a first data line (first numbered data line) BL1 and a second data line (second numbered data line) BL2.

Likewise, the n-th cell unit CELLn includes the first and second memory strings MS1, MS2 which are connected to the n-th data line (n-numbered data line) BLn and the (n+i)-th data line ((n+1)-numbered data line) BL (n+1).

A plurality of nonvolatile memory devices in the first and second memory strings MS1, MS2 hold, for example, one (one bit) of an erase state ("1" state) having a low threshold value (low-Vth) and a write state ("0" state) having a high threshold value (high-Vth).

Configuration Memory Setup

First, setup operation is performed at a time t1. The setup operation is as follows.

(1) The select gate lines SGD, SGS are set at an ON potential Vsg-pass (for example, +4V). At this occasion, the select gate transistors connected to the select gate lines SGD, SGS are in the ON state.

(2) Unselected first and third control lines WL1, WL3 connected to unselected contexts are set at a transfer potential Vpass. The transfer potential Vpass is a potential at which the nonvolatile memory device can be changed to the ON state regardless the threshold value (low-Vth/high-Vth) of the nonvolatile memory device.

Therefore, all the unselected nonvolatile memory devices connected to the unselected first and third control lines WL1, WL3 are in the ON state.

(3) The selected second control line WL2 connected to the selected context is set at a read potential Vread. Vread has a value which is higher than the threshold value (low-Vth) of the erase state and which is lower than the threshold value (high-Vth) of the write state.

Therefore, when, in the first cell unit CELL1, the nonvolatile memory device MC12 is in the erase state and the nonvolatile memory device MC22 is in the write state, then the nonvolatile memory device MC12 is in the ON state, and the nonvolatile memory device MC22 is in the OFF state.

When, in the n-th cell unit CELLn, the nonvolatile memory device MC12 is in the write state, and the nonvolatile memory device MC22 is in the erase state, then the nonvolatile memory device MC12 is in the OFF state, and the nonvolatile memory device MC22 is in the ON state.

(4) The first potential (for example, ground potential Vss) is applied to the odd numbered data lines, and the second potential (for example, power supply potential Vdd) is applied to the even numbered data lines.

As a result, the first potential is transferred from the first data line BL1 to the common node CN1 connected to the first cell unit CELL1. Accordingly, regardless of the held data in the past, the flip-flop circuit FF1 is in the following state: the common node CN1 is at the first potential, and the configuration data output node OUT1 is at the second potential. Thereafter, this state is maintained.

Then, the second potential is output, as output data DATA1, from the configuration data output node OUT1.

The second potential is transferred from the (n+1)-th data line BL (n+1) to the common node CNn connected to the n-th cell unit CELLn. Accordingly, regardless of the held data in the past, the flip-flop circuit FFn is in the following state: the common node CNn is at the second potential, and the configuration data output node OUTn is at the first potential. Thereafter, this state is maintained.

Then, the first potential is output, as output data DATAn, from the configuration data output node OUTn.

Start Processing

Subsequently, at a time t2, FPGA operation is performed. The FPGA operation is as follows.

All the control lines WL1, WL2, WL3, all the select gate lines SGD, SGS, and all the data lines BL1, ... BL (n+1) are set at the ground potential (0V). However, the supply of the power supply potential Vdd and the ground potential Vss to the flip-flop circuit FF are continuously maintained.

Accordingly, the flip-flop circuits FF1, ... FFn maintain the values set during the period from t1 to t2, and continue to output the values to the configuration data output nodes OUT1, ... OUTn.

As described above, in this example, the context data stored in each memory pair are transferred to the flip-flop circuit during the configuration memory setup. Then, during the FPGA operation, the flip-flop circuit outputs the context data to the configuration data output node.

More specifically, in this example, during the FPGA operation, bias potentials such as the ON potential Vsg-pass, the read potential Vread, and the transfer potential Vpass are not applied to the select gate transistor and the nonvolatile memory device in the memory string.

2. Write Operation

FIG. 4 illustrates a state during write operation.

In this case, a case will be explained where a context is selectively written to the nonvolatile memory device MC12 in the cell unit CELL11 connected to the second control line WL2.

In this example, one bit is written to one memory pair in the cell unit CELL11 (all the remaining memory pairs are unselected). Alternatively, one context (a plurality of bits) may be written at a time.

For example, one context ((n+1)/2 bits) can be written, in parallel, to (n+1) nonvolatile memory devices ((n+1)/2 memory pairs) connected to the second control line WL2. Here, n is an odd number.

In the initial state before write operation (state in which content is not written at all), nonvolatile memory devices in all the cell units CELL11, CELL12, ... CELLn1, CELLn2 are in the erase state ("1" state) having the low threshold value (low-Vth).

For example, the write operation is done by changing the threshold values of the selected nonvolatile memory devices from the low threshold value (low-Vth) to the high threshold value (high-Vth). The threshold values are changed in an order from the source side (common node side) nonvolatile memory devices to the drain-side nonvolatile memory devices.

(1) The selected second control line WL2 connected to the cell unit CELL11 is set at the write potential (for example, +18V) Vprg.

(2) The first data line BL1 connected to the cell unit CELL11 is set at the write potential, for example, the ground potential Vss, and the second data line BL2 connected to the cell unit CELL11 is set at the write inhibit potential (Vinhibit), for example, +4V.

(3) The unselected first and third control lines WL1, WL3 connected to the cell unit CELL11 are set at the transfer potential (for example, +10V) Vpass.

The drain-side select gate line SGD connected to the cell unit CELL11 is set at the ON potential (for example, +4V) Vsg-pass, and the source side select gate line SGS connected to the cell unit CELL11 is set at the OFF potential (for example, 0V) Vsg-off.

The transfer potential Vpass and the ON potential Vsg-pass are potentials for transferring the write potential or the write inhibit potential to the channels of the nonvolatile memory devices constituting the first and second memory strings MS1, MS2 in the cell unit CELL.

In the nonvolatile memory device MC12 in which the write potential is applied to the channel, when the write potential Vprg is applied to the selected second control line WL2, the nonvolatile memory device MC12 changes from the erase state ("1" state) having the low threshold value (low-Vth) to the write state ("0" state) having the high threshold value (high-Vth).

In contrast, in the nonvolatile memory device MC22 in which the write inhibit potential is applied to the channel, when the write potential Vprg is applied to the selected second control line WL2, the drain-side select gate transistor in the memory string MS2 changes to the cutoff state, and the channel potential is increased (boosted). Accordingly, in the nonvolatile memory device MC22, the erase state ("1" state) having the low threshold value (low-Vth) is maintained (self-boost write-preventing method).

Vinhibit may be transferred to the channel of the memory string MS2, so as to prevent writing (Vinihibit-application write-preventing method). In this case, Vinhibit is about 8V, which is higher than the self-boost write-preventing method. Vsg-pass is set at about 10V, so that the drain-side select gate transistor is in the ON state at all times, which enables transfer of Vinhibit.

(4) All the control lines WL1, WL2, WL3 connected to the unselected cell unit CELL12, CELLn2 are set in the floating state. All the select gate lines SGD, SGS connected to the unselected cell units CELL11, CELLn2 are set at the OFF potential (for example, 0V) Vsg-off.

(5) All the first and second data lines BLn, BL (n+1) connected to the unselected cell unit CELLn1, CELLn2 are set at the write inhibit potential (Vinhibit), for example, +4V.

In this write operation as described above, the source side select gate transistors in all the cell units CELL11, CELL12, CELLn1, CELLn2 are in the OFF state due to Vsg-off applied to the select gate lines SGS, and therefore, the write inhibit potential (for example, +4V) Vinhibit is not transferred to the flip-flop circuits FF11, FF12, FFn1, FFn2.

Accordingly, this can prevent the flip-flop circuit from breaking down, when a high bias is applied during the write operation.

3. Erase Operation

Figure 5:
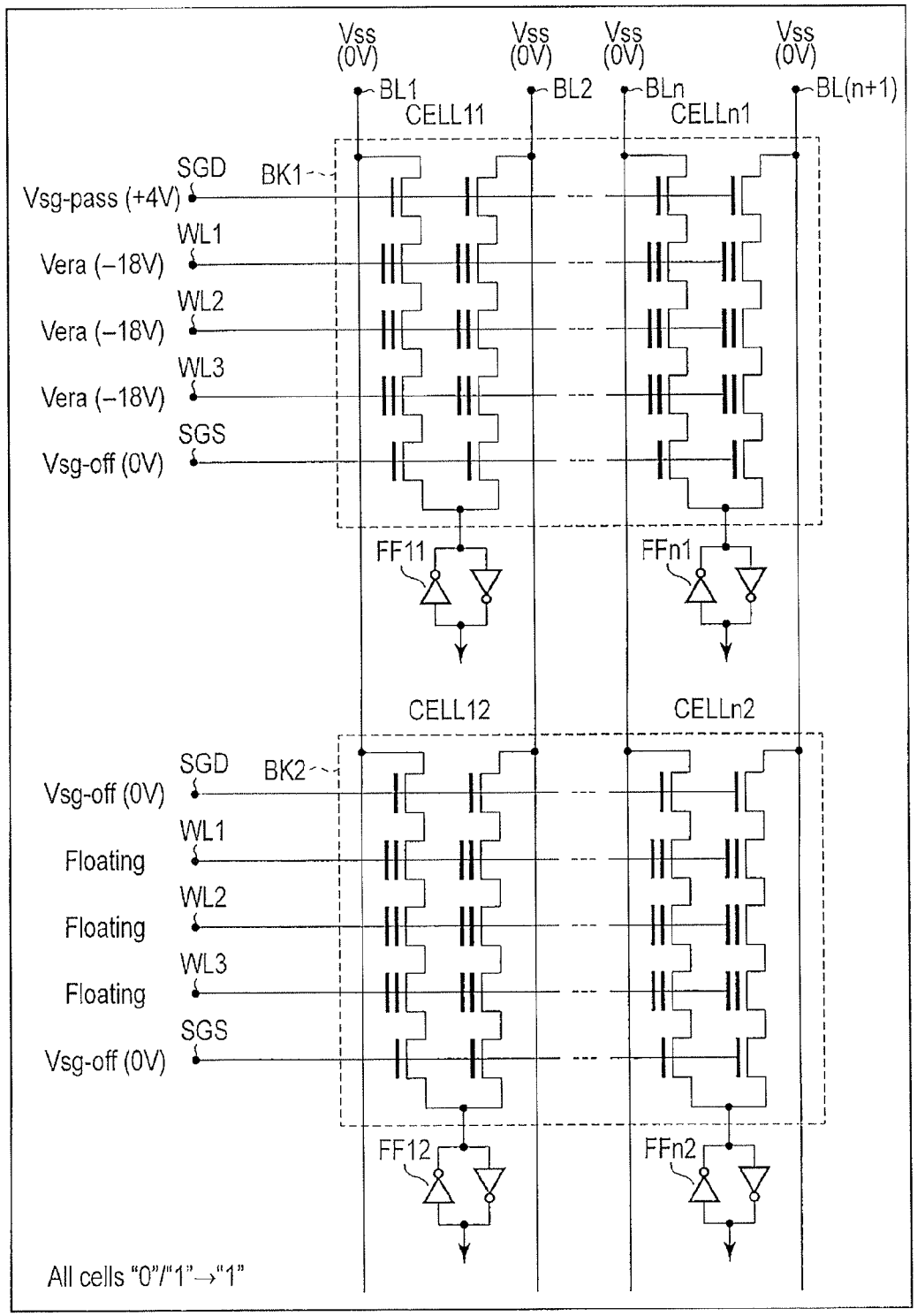
FIG. 5 is a circuit diagram illustrating a state of erase operation.

FIG. 5 illustrates a state of the basic unit during the erase operation.

In this case, multiple cell units sharing the same first, second, and third control lines WL1, WL2, WL3 are referred to as one block. In this case, the erase operation is performed in units of blocks (block erase).

In this example, cell units CELL11, CELLn1 are defined as a first block BK1, and the erase operation is executed on the first block BK1 (block erase). At this occasion, the erase operation is not performed on a second block BK2 including unselected cell units CELL12, CELLn2.

Alternatively, it is to be understood that the erase operation can also be executed, at the same time, on all the cell units CELL11, CELLn1, CELL12, CELLn2 (chip erase).

(1) All the control lines WL1, WL2, WL3 in the selected block BK1 is set at the erase potential (for example, −18V) Vera.

The drain-side select gate line SGD in the selected block BK1 is set at the ON potential (for example, +4V) Vsg-pass, and the source side select gate line SGS in the selected block BK1 is set at the OFF potential (for example, 0V) Vsg-off.

(2) All the data lines BL1, BL2, BLn, BL (n+1) which are shared by all the blocks BK1, BK2 are set at, for example, the ground potential Vss.

In this case, for example, the ON potential Vsg-pass is a potential for transferring the ground potential Vss to the channels of all the nonvolatile memory devices in the selected block BK1.

Therefore, in all the nonvolatile memory devices in the selected block BK1 in which the ground potential Vss is applied to the channel, when the erase potential Vera is applied to all the control lines in the selected block BK1, all the nonvolatile memory devices change to the erase state ("1" state) having the low threshold value (low-Vth) regardless of the threshold value of each nonvolatile memory device.

(3) All the control lines WL1, WL2, WL3 in the unselected block BK2 are set in the floating state. All the select gate lines SGD, SGS in the unselected block BK2 are set at the OFF potential (for example, 0V) Vsg-off.

Figure 22:
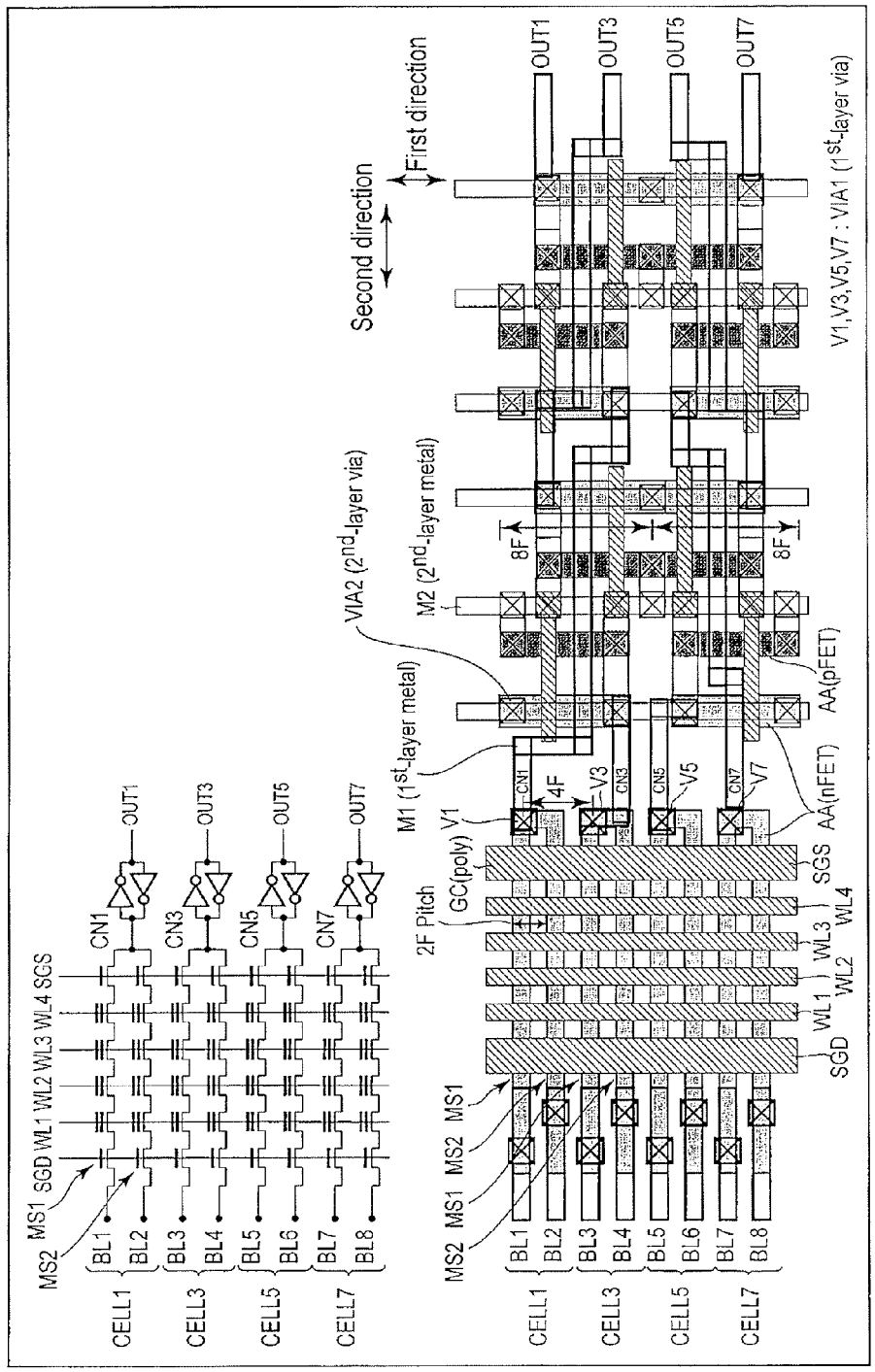
FIG. 22 is a figure illustrating a layout of a configuration memory.

FIG. 22 illustrates an example of a layout diagram of a circuit according to the first embodiment.

This layout relates to a relationship of each element when multiple configuration memories are arranged as an array.

For example, the first and second memory strings MS1, MS2 of the first configuration memory CELL1 and the first and second memory strings MS1, MS2 of the second configuration memory CELL3 are arranged with a first pitch 2F in the first direction, and extend in the second direction perpendicular to the first direction.

A common node CN1 of the first configuration memory CELL1 is, for example, a first via V1 (VIA1: 1st-layer via), and a common node CN3 of the second configuration memory CELL3 is, for example, a second via V3 (VIAL 1st-layer via). In this case, the first and second vias V1, V3 are arranged in the first direction with a second pitch 4F which is twice the first pitch 2F.

Both of the flip-flop circuits FF of the first and second configuration memories CELL1, CELL3 are arranged within a range of a third pitch 8F, which is twice the second pitch 4F, in the first direction and are arranged side by side in the second direction.

This will be explained in more details.

The first memory string MS1 and the second memory string MS2, which belong to one cell unit CELLi (i=1, 3, 5, 7, . . . ), are formed on one active area AA. In this case, in the present embodiment, one active area has a folded shape, and the folded portion is a common node CNi (i=1, 3, 5, 7, . . . ) serving as a connection portion between the first and second memory strings MS1, MS2.

One via Vi (i=1, 3, 5, 7, . . . ) is connected to the connection portion (folded portion of active area AA) of the first and second memory strings MS1, MS2. This via Vi also constitutes the common node CNi.

As described above, the active area AA is made into a folded shape (C-shape), and therefore, it is sufficient to provide only one via (the contact via for the active area) for one cell unit CELLi. If one active area is provided for one memory string, two vias must be provided for one cell unit CELLi.

Therefore, according to the layout of the present embodiment, the number of contact vias can be reduced, and the area size of the configuration memory array can be reduced.

For example, when the minimum processing size of lithography is denoted as F (feature size), the first pitch of the first and second memory strings MS1, MS2 (active area AA) of the cell unit CELLi can be 2F. In this case, the average value of the pitch between the common node CNi and the configuration output node OUTi (i=1, 3, 5, 7, . . . ) can be the second pitch 4F which is twice the first pitch.

This is an arrangement in which the common node CNi and configuration output node OUTi have the minimum repeating cycle in the first direction. When this layout is employed, the footprint of the configuration memory can be reduced to an extremely small size.

(Effects)

The features of the configuration memory of this example are summarized as follows.

(1) One context is stored in one or more memory pairs constituted by nonvolatile memory devices, and therefore, the context can be held even when the power supply is shut off. Therefore, the technique for turning off the power in the standby state can be supported.

(2) One context is stored in one of a plurality of nonvolatile memory devices connected in series. The number of nonvolatile memory devices connected in series may be increased as the number of contexts increases. Therefore, the area size of the configuration memory can be reduced to an extremely small size as compared with the one using the SRAMs.

(3) During the FPGA operation, the context is latched in the flip-flop circuit, and therefore, it is not necessary to apply high biases such as the read potential Vread and the transfer potential Vpass to the nonvolatile memory device, and this can prevent read disturb.

(Modification)

Hereinafter, modifications of the base unit as explained with reference to FIGS. 1 to 5 will be explained.

In the configuration memory as described above, the drive current of the nonvolatile memory device in the memory string needs to have a sufficient magnitude for inverting data held in the flip-flop circuit. For this reason, in general, the size of the nonvolatile memory device (channel width) needs to be increased. This is not desirable in view of the purpose of reducing the area size of the configuration memory.

In the following modifications, suggested are techniques for correctly transferring the context in the nonvolatile memory device to the flip-flop circuit at a high speed without increasing the size of the nonvolatile memory device in the memory string.

More specifically, in the following modifications, circuits for assisting transfer process of the context from the nonvolatile memory device to the flip-flop circuit are suggested.

1. First Modification

Figure 7:
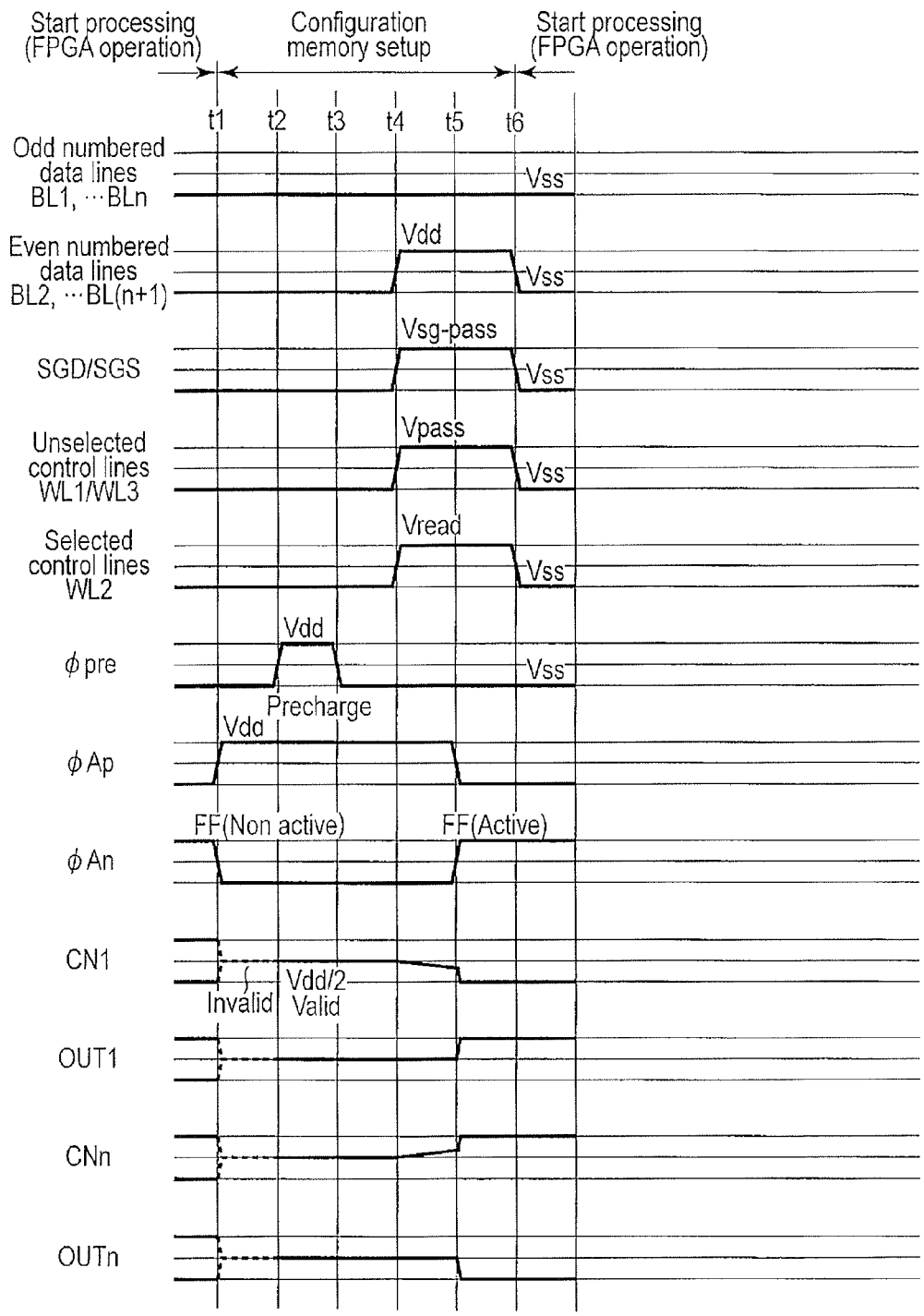
FIG. 7 is a waveform chart illustrating read operation of the circuit of FIG. 6.

FIG. 6 illustrates the first modification of the configuration memory of FIG. 2. Like FIG. 2, FIG. 6 illustrates a state of the basic units during read operation. FIG. 7 is a waveform chart illustrating read operation.

First, a configuration of the configuration memory of the present example will be explained.

In the explanation below, however, elements different from the basic unit of FIG. 2 will be explained. The same elements as those of the basic unit of FIG. 2 are denoted with the same reference numerals, and detailed description thereabout is omitted.

The source terminals of P-channel type FETs P1, P2 in the flip-flop circuits FF1, . . . FFn are connected to a local power supply line P-local. The source terminals of N-channel type FETs N1, N2 in the flip-flop circuits FF1, . . . FFn are connected to a local ground line G-local.

On the other hand, a power supply potential Vdd is applied to the global power supply line P-global, and a ground potential Vss is applied to the global ground line G-global.

A power switch (for example, P-channel type FET) SW-power is connected between the global power supply line P-global and the local power supply line P-local. When the power switch SW-power is, for example, a P-channel type FET, a control signal φAp is input to the control terminal (gate terminal) of the power switch SW-power.

A ground switch (for example, N-channel type FET) SW-ground is connected between the global ground line G-global and the local ground line G-local. When the ground switch SW-ground is, for example, an N-channel type FET, a control signal φAn is input to the control terminal (gate terminal) of the ground switch SW-ground.

A precharge potential (for example, Vdd/2) is applied to a precharge power supply line P-pre. A first precharge switch (for example, N-channel type FET) SW-pre1 is connected between the precharge power supply line P-pre and the common nodes CN1, . . . CNn.

A second precharge switch (for example, N-channel type FET) SW-pre2 is connected between the precharge power supply line P-pre and the configuration output nodes OUT1, . . . OUTn.

Further, an equalize switch (for example, N-channel type FET) SW-equal is connected between the common nodes CN1, . . . CNn and the configuration output nodes OUT1, . . . OUTn.

When these switches SW-pre1, SW-pre2, SW-equal are, for example, N-channel type FETs, a control signal φpre is input to the control terminals (gate terminals) of these switches SW-pre1, SW-pre2, SW-equal.

Subsequently, basic operation of the configuration memory according to this example will be explained.

In the basic operation, write operation and erase operation are the same as those explained with reference to FIGS. 4 and 5, and therefore, description thereabout is omitted here.

In the explanation below, the read operation will be explained.

A selected context has (n+1)/2 bits stored in (n+1) nonvolatile memory devices ((n+1)/2 memory pairs) connected to the second control line WL2. In this case, n is an odd number.

In this case, the first cell unit CELL1 includes first and second memory strings MS1, MS2 which are connected to a first data line BL1 and a second data line BL2.

Likewise, the n-th cell unit CELLn includes the first and second memory strings MS1, MS2 which are connected to the n-th data line BLn and the (n+1)-th data line BL (n+1).

A plurality of nonvolatile memory devices in the first and second memory strings MS1, MS2 hold, for example, one (one bit) of an erase state ("1" state) having a low threshold value (low-Vth) and a write state ("0" state) having a high threshold value (high-Vth).

Configuration Memory Setup

First, setup operation is performed at times t1 to t6. The setup operation is as follows.

At the time t1, for example, the control signal φAn is set at the ground potential Vss, and the control signal φAp is set at the power supply potential Vdd.

As a result, both of the power switch SW-power and the ground switch SW-ground are in the OFF state, so that the power supply to the flip-flop circuits FF1, . . . FFn is shut off. In other words, the flip-flop circuits FF1, . . . FFn are inactivated.

At the time t2, for example, the control signal φpre is set at the power supply potential Vdd, and a first precharge switch SW-pre1, a second precharge switch SW-pre2, and a equalize switch SW-equal are set in the ON state.

As a result, the precharge potential (for example, Vdd/2) applied to the precharge power supply line P-pre passes through these switches SW-pre1, SW-pre2, SW-equal, and is transferred to the common nodes CN1, . . . CNn and the configuration output nodes OUT1, . . . OUTn. In other words, the potentials of the common nodes CN1, . . . CNn and the configuration output nodes OUT1, . . . OUTn are precharged to the precharge potential, and equalized.

In this example, the time t1 and the time t2 are separately set. However, both of them may be done with the same timing (both of them may be done at the same time).

At the time t3, for example, the control signal φpre is set at the ground potential Vss, and each of the first precharge switch SW-pre1, the second precharge switch SW-pre2, and the equalize switch SW-equal is set in the OFF state.

As a result, the common nodes CN1, . . . CNn and configuration output nodes OUT1, . . . OUTn are cut off from the precharge power supply line P-pre.

At the time t4, the select gate lines SGD, SGS are set at the ON potential Vsg-pass (for example, +4V), the unselected first and third control lines WL1, WL3 are set at the transfer potential Vpass, and the selected second control line WL2 is set at the read potential Vread.

A first potential (for example, ground potential Vss) is applied to the odd numbered data lines BL1, BLn, and a second potential (for example, power supply potential Vdd) is applied to the even numbered data lines BL2, . . . BL (n+1).

In this case, when, in the first cell unit CELL1, the nonvolatile memory device MC12 is in the erase state and the nonvolatile memory device MC22 is in the write state, then the nonvolatile memory device MC12 is in the ON state and the nonvolatile memory device MC22 is in the OFF state.

When, in the n-th cell unit CELLn, the nonvolatile memory device MC12 is in the write state and the nonvolatile memory device MC22 is in the erase state, then the nonvolatile memory device MC12 is in the OFF state and the nonvolatile memory device MC22 is in the ON state.

As a result, the first potential is transferred from the first data line BL1 to the common node CN1 connected to the first cell unit CELL1. Therefore, the potential of the common node CN1 begins to gradually decrease from the precharge potential (for example, Vdd/2).

The second potential is transferred from the (n+1)-th data line BL (n+1) to the common node CNn connected to the n-th cell unit CELLn. Therefore, the potential of the common node CNn begins to gradually increase from the precharge potential (for example, Vdd/2).

In this example, the time t3 and the time t4 are separately set. However, both of them may be done with the same timing (both of them may be done at the same time).

At the time t5, for example, the control signal φAn is set at the power supply potential Vdd, and the control signal φAp is set at the ground potential Vss.

As a result, both of the power switch SW-power and the ground switch SW-ground are in the ON state, and the power supply to the flip-flop circuits FF1, . . . FFn is started. In other words, the flip-flop circuits FF1, . . . FFn are activated.

Therefore, in the flip-flop circuit FF1 corresponding to the first cell unit CELL1, the common node CN1 is rapidly fixed to the "Low (Vss)" state, and the configuration data output node OUT1 is rapidly fixed to the "High (Vdd)" state.

In the flip-flop circuit FFn corresponding to the n-th cell unit CELLn, the common node CNn is rapidly fixed to the "High (Vdd)" state, and the configuration data output node OUTn is rapidly fixed to the "Low (Vss)" state.

More specifically, the output data DATA1 are fixed to the "High" state, and the output data DATAn are fixed to the "Low" state.

Immediately before the flip-flop circuits FF1, . . . FFn are activated, the potential level (High or Low) of each of the common nodes CN1, . . . CNn and the configuration output nodes OUT1, . . . OUTn may not be fixed.

More specifically, at that time, it is sufficient to have a difference in the magnitude between the potential level of the common nodes CN1, . . . CNn and the potential level of the configuration output nodes OUT1, . . . OUTn.

Start Processing

Subsequently, at the time t6, the FPGA operation is performed. The FPGA operation is as follows.

All the control lines WL1, WL2, WL3, all the select gate lines SGD, SGS, and all the data lines BL1, . . . BL (n+1) are set at the ground potential (0V). However, the power supply potential Vdd and the ground potential Vss are continuously supplied to the flip-flop circuit FF.

Accordingly, flip-flop circuits FF1, . . . FFn maintain the values set during the period from t1 to t6, and continue to output the values to the configuration data output nodes OUT1, . . . OUTn.

As described above, in this example, the context data stored in each memory pair are transferred to the flip-flop circuit during the configuration memory setup. Then, during the FPGA operation, the flip-flop circuit output the context data to the configuration data output node.

More specifically, in this example, during the FPGA operation, bias potentials such as the read potential Vread, the transfer potential Vpass, and the ON potential Vsg-pass are not applied to the nonvolatile memory device and the select gate transistor in the memory string.

In this example, the time t5 and the time t6 are separately set. However, both of them may be done with the same timing (both of them may be done at the same time).

According to the configuration memory of this example, the same effects as the basic unit of FIGS. 1 and 2 can be obtained. In addition, this example is characterized in that, even when the drive current of the nonvolatile memory device is small, i.e., even when the size (channel width) is small, data can be set correctly to the flip-flop circuit at a high speed. The reason of this is as follows.

(1) During transfer of the context data from the nonvolatile memory device to the flip-flop circuit, the flip-flop circuit is inactivated.

At this occasion, if the flip-flop circuit is activated, the nonvolatile memory device is required to have a higher current drive performance than that of the flip-flop circuit (data hold performance).

In this example, during the data transfer from the nonvolatile memory device to the flip-flop circuit, the flip-flop circuit is inactivated. Therefore, such a high current drive performance is not required.

(2) During the transfer of the context data from the nonvolatile memory device to the flip-flop circuit, it is sufficient for the nonvolatile memory device to have performance for making a slight difference in the potential level between the common node and the configuration output node.

Immediately before the transfer of the context data, the common node and the configuration output node are precharged and equalized. Therefore, it is easy, with the nonvolatile memory device, to make a slight difference in the potential level between the common node and the configuration output node.

(3) When there exists a slight difference in the potential level between the common node and the configuration output node immediately before the activation, the flip-flop circuit can fix and hold the context data with the activation.

More specifically, in this example, the potential of the common node need not be determined only by the current drive performance of the nonvolatile memory device.

According to this example, the circuit for assisting the transfer process of the context from the nonvolatile memory device to the flip-flop circuit is newly added. Therefore, the reduction of the area size of the configuration memory can be achieved with the reduction of the size of the nonvolatile memory device.

This effect becomes more significant as the number of contexts increases.

Whether the basic unit of FIG. 2 is employed or the basic unit of FIG. 6 is employed is preferably determined based upon the number of contexts. More specifically, in this example, although the size of the nonvolatile memory device is reduced, there exists overhead in the size of area due to the circuit for assisting the transfer process.

Therefore, for example, it is desirable to employ the following method: e.g., when the number of contexts is less than a certain number, the basic unit of FIG. 2 is employed, and when the number of contexts is larger than a certain number, the basic unit of FIG. 6 is employed.

2. Second Modification

Figure 9:
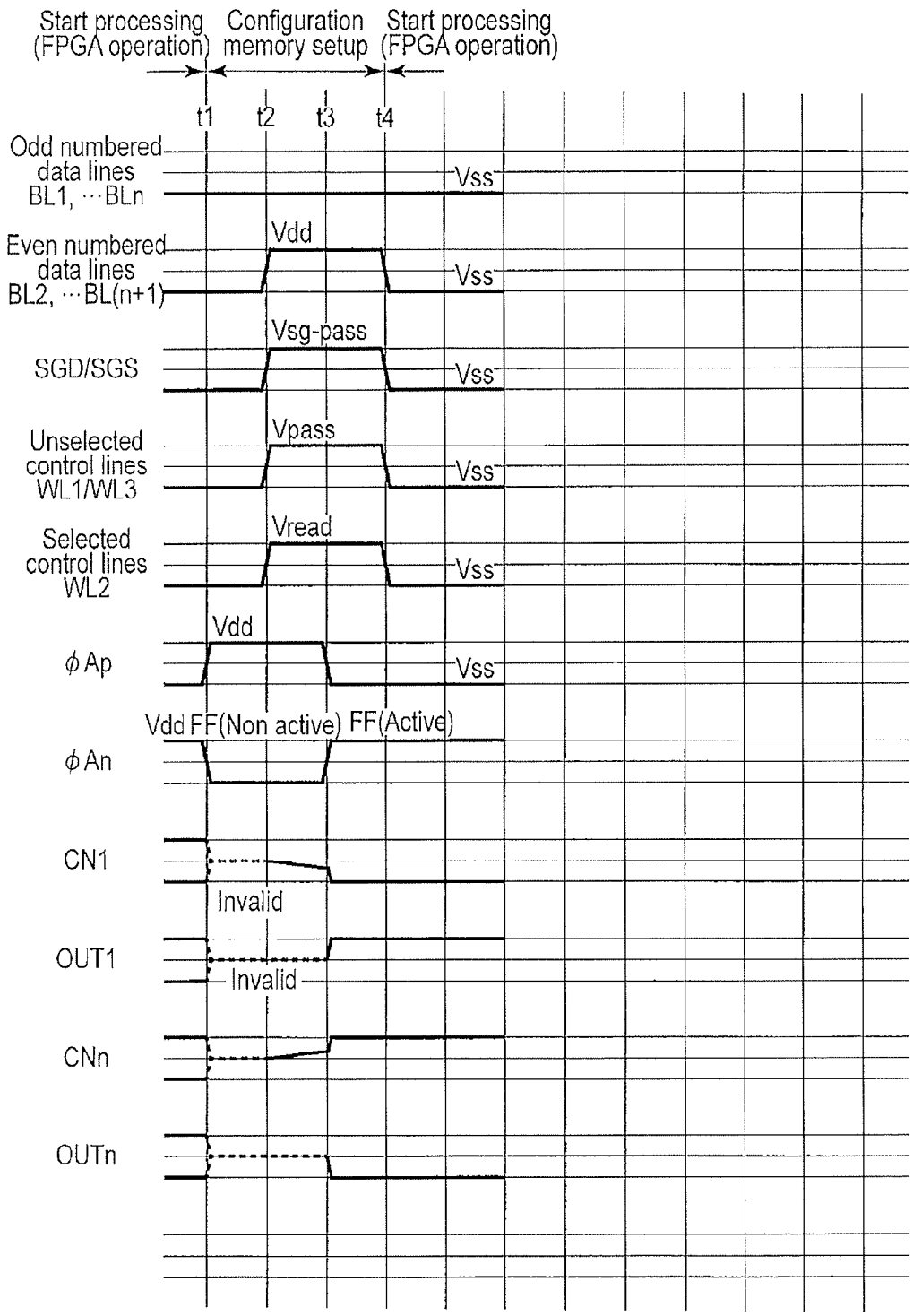
FIG. 9 is a waveform chart illustrating read operation of the circuit of FIG. 8.

FIG. 8 illustrates the second modification of the configuration memory of FIG. 2. Like FIG. 2, FIG. 8 illustrates a state of the basic units during read operation. FIG. 9 is a waveform chart illustrating read operation.

First, a configuration of the configuration memory of the present example will be explained.

In the explanation below, however, elements different from the basic unit of FIG. 2 will be explained. The same elements as those of the basic unit of FIG. 2 are denoted with the same reference numerals, and detailed description thereabout is omitted.

The source terminals of P-channel type FETs P1, P2 in the flip-flop circuits FF1, . . . FFn are connected to a local power supply line P-local. The source terminals of N-channel type FETs N1, N2 in the flip-flop circuits FF1, . . . FFn are connected to a local ground line G-local.

On the other hand, a power supply potential Vdd is applied to the global power supply line P-global, and a ground potential Vss is applied to the global ground line G-global.

A power switch (for example, P-channel type FET) SW-power is connected between the global power supply line P-global and the local power supply line P-local. When the power switch SW-power is, for example, a P-channel type FET, a control signal φAp is input to the control terminal (gate terminal) of the power switch SW-power.

A ground switch (for example, N-channel type FET) SW-ground is connected between the global ground line G-global and the local ground line G-local. When the ground switch SW-ground is, for example, an N-channel type FET, a control signal φAn is input to the control terminal (gate terminal) of the ground switch SW-ground.

As compared with the first modification of FIG. 6, this example is characterized in that the precharge switches SW-pre1, SW-pre2, and the equalize switch SW-equal are omitted.

Subsequently, basic operation of the configuration memory according to this example will be explained.

In the basic operation, write operation and erase operation are the same as those explained with reference to FIGS. 4 and 5, and therefore, description thereabout is omitted here.

In the explanation below, the read operation will be explained.

Like the first modification, a selected context has (n+1)/2 bits stored in (n+1) nonvolatile memory devices ((n+1)/2 memory pairs) connected to the second control line WL2. In this case, n is an odd number.

Configuration Memory Setup

First, setup operation is performed from times t1 to t4. The setup operation is as follows.

At the time t1, for example, the control signal φAn is set at the ground potential Vss, and the control signal φAp is set at the power supply potential Vdd.

As a result, both of the power switch SW-power and the ground switch SW-ground are in the OFF state, so that the power supply to the flip-flop circuits FF1, . . . FFn is shut off. In other words, the flip-flop circuits FF1, . . . FFn are inactivated.

At the time t2, the select gate lines SGD, SGS are set at the ON potential Vsg-pass (for example, +4V), the unselected first and third control lines WL1, WL3 are set at the transfer potential Vpass, and the selected second control line WL2 is set at the read potential Vread.

A first potential (for example, ground potential Vss) is applied to the odd numbered data lines BL1, . . . BLn, and a second potential (for example, power supply potential Vdd) is applied to the even numbered data lines BL2, . . . BL (n+1).

In this case, when, in the first cell unit CELL1, the nonvolatile memory device MC12 is in the erase state and the nonvolatile memory device MC22 is in the write state, then the nonvolatile memory device MC12 is in the ON state and the nonvolatile memory device MC22 is in the OFF state.

When, in the n-th cell unit CELLn, the nonvolatile memory device MC12 is in the write state and the nonvolatile memory device MC22 is in the erase state, then the nonvolatile memory device MC12 is in the OFF state and the nonvolatile memory device MC22 is in the ON state.

As a result, the first potential is transferred from the first data line BL1 to the common node CN1 connected to the first cell unit CELL1. Therefore, the potential of the common node CN1 begins to decrease.

The second potential is transferred from the (n+1)-th data line BL (n+1) to the common node CNn connected to the n-th cell unit CELLn. Therefore, the potential of the common node CNn begins to increase.

In this example, the time t1 and the time t2 are separately set. However, both of them may be done with the same timing (both of them may be done at the same time).

At the time t3, for example, the control signal φAn is set at power supply potential Vdd, and the control signal φAp is set at the ground potential Vss.

As a result, both of the power switch SW-power and the ground switch SW-ground are in the ON state, and the power supply to the flip-flop circuits FF1, . . . FFn is started. In other words, the flip-flop circuits FF1, . . . FFn are activated.

Therefore, in the flip-flop circuit FF1 corresponding to the first cell unit CELL1, the common node CN1 is rapidly fixed to the "Low (Vss)" state, and the configuration data output node OUT1 is rapidly fixed to the "High (Vdd)" state.

In the flip-flop circuit FFn corresponding to the n-th cell unit CELLn, the common node CNn is rapidly fixed to the "High (Vdd)" state, and the configuration data output node OUTn is rapidly fixed to the "Low (Vss)" state.

More specifically, the output data DATA1 are fixed to the "High" state, and the output data DATAn are fixed to the "Low" state.

Start Processing

Subsequently, at the time t4, the FPGA operation is started. The FPGA operation is the same as the operation explained in the first modification, and therefore description thereabout is omitted.

In this example, the time t3 and the time t4 are separately set. However, both of them may be done with the same timing (both of them may be done at the same time).

According to this example, the circuit for assisting the transfer process of the context from the nonvolatile memory device to the flip-flop circuit includes only the power switch SW-power and the ground switch SW-ground. Therefore, as compared with the first modification, there is an advantage in that there is a smaller overhead in the size of area due to the circuit for assisting the transfer process.

3. Third Modification

Figure 11:
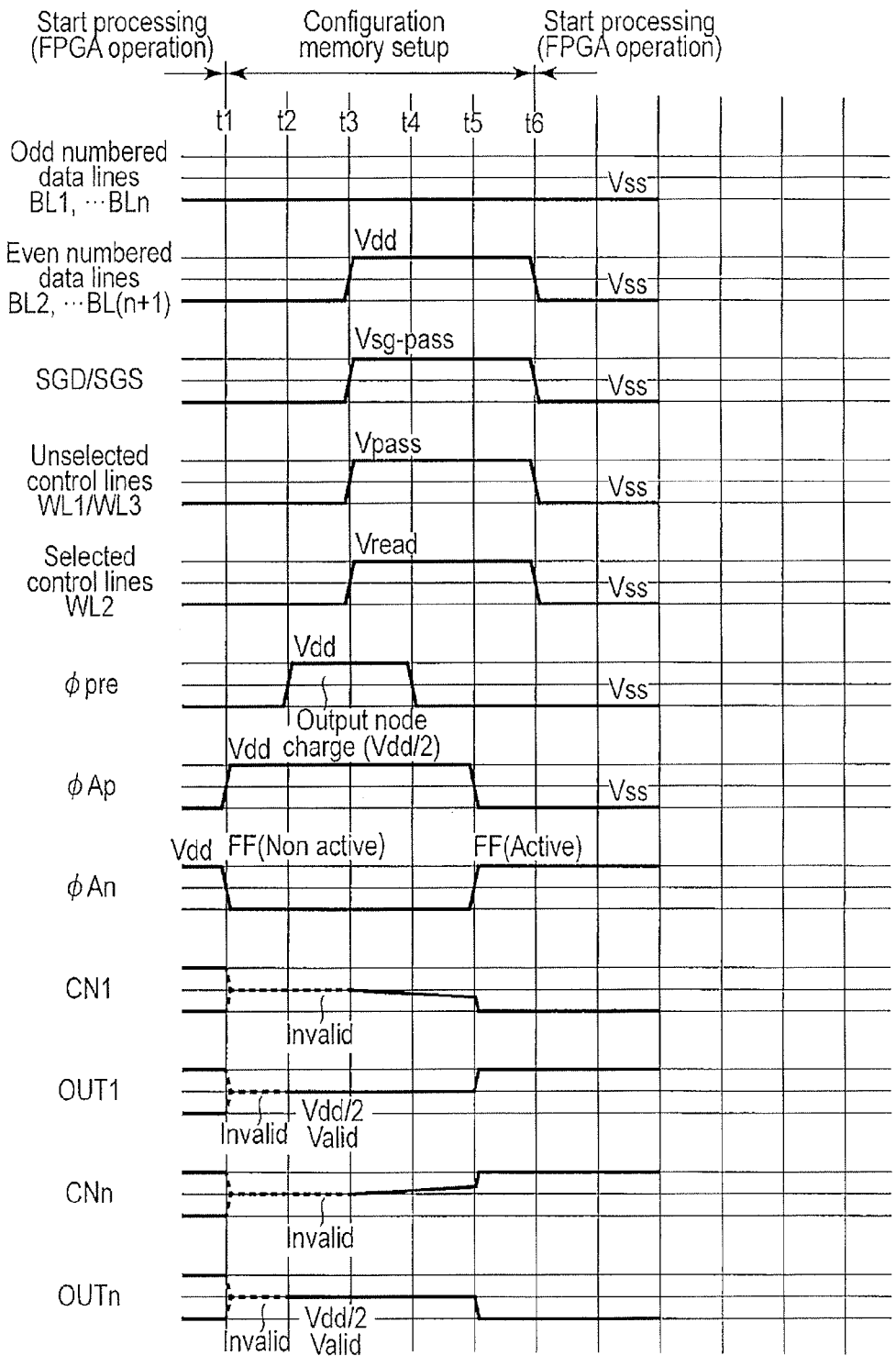
FIG. 11 is a waveform chart illustrating read operation of the circuit of FIG. 10.

FIG. 10 illustrates the third modification of the configuration memory of FIG. 2. Like FIG. 2, FIG. 10 illustrates a state of the basic units during read operation. FIG. 11 is a waveform chart illustrating read operation.

First, a configuration of the configuration memory of the present example will be explained.

In the explanation below, however, elements different from the basic unit of FIG. 2 will be explained. The same elements as those of the basic unit of FIG. 2 are denoted with the same reference numerals, and detailed description thereabout is omitted.

The source terminals of P-channel type FETs P1, P2 in the flip-flop circuits FF1, . . . FFn are connected to a local power supply line P-local. The source terminals of N-channel type FETs N1, N2 in the flip-flop circuits FF1, . . . FFn are connected to a local ground line G-local.

On the other hand, a power supply potential Vdd is applied to the global power supply line P-global, and a ground potential Vss is applied to the global ground line G-global.

A power switch (for example, P-channel type FET) SW-power is connected between the global power supply line P-global and the local power supply line P-local. When the power switch SW-power is, for example, a P-channel type FET, a control signal φAp is input to the control terminal (gate terminal) of the power switch SW-power.

A ground switch (for example, N-channel type FET) SW-ground is connected between the global ground line G-global and the local ground line G-local. When the ground switch SW-ground is, for example, an N-channel type FET, a control signal φAn is input to the control terminal (gate terminal) of the ground switch SW-ground.

A precharge potential (for example, Vdd/2) is applied to a precharge power supply line P-pre. A precharge switch (for example, N-channel type PET) SW-pre2 is connected between the precharge power supply line P-pre and the configuration output nodes OUT1, . . . OUTn.

When the precharge switch SW-pre2 is, for example, N-channel type FET, a control signal φpre is input to the control terminal (gate terminal) of the precharge switch SW-pre2.

As compared with the first modification of FIG. 6, this example is characterized in that the precharge switch SW-pre1 and the equalize switch SW-equal are omitted.

Subsequently, basic operation of the configuration memory according to this example will be explained.

In the basic operation, write operation and erase operation are the same as those explained with reference to FIGS. 4 and 5, and therefore, description thereabout is omitted here.

In the explanation below, the read operation will be explained.

Like the first modification, a selected context has (n+1)/2 bits stored in (n+1) nonvolatile memory devices ((n+1)/2 memory pairs) connected to the second control line WL2. In this case, n is an odd number.

Configuration Memory Setup

First, setup operation is performed from times t1 to t7. The setup operation is as follows.

At the time t1, for example, the control signal φAn is set at the ground potential Vss, and the control signal φAp is set at the power supply potential Vdd.

As a result, both of the power switch SW-power and the ground switch SW-ground are in the OFF state, so that the power supply to the flip-flop circuits FF1, . . . FFn is shut off. In other words, the flip-flop circuits FF1, . . . FFn are inactivated.

At the time t2, for example, the control signal φpre is set at the power supply potential Vdd, and the second precharge switch SW-pre2 is set in the ON state.

As a result, the precharge potential (for example, Vdd/2) applied to the precharge power supply line P-pre passes through the precharge switch SW-pre2, and is transferred to the configuration output nodes OUT1, . . . OUTn. In other words, the potentials of the configuration output nodes OUT1, . . . OUTn are precharged to the precharge potential.

In this example, the time t1 and the time t2 are separately set. However, both of them may be done with the same timing (both of them may be done at the same time).

At the time t3, the select gate lines SGD, SGS are set at the ON potential Vsg-pass (for example, +4V), the unselected first and third control lines WL1, WL3 are set at the transfer potential Vpass, and the selected second control line WL2 is set at the read potential Vread.

A first potential (for example, ground potential Vss) is applied to the odd numbered data lines BL1, . . . BLn, and a second potential (for example, power supply potential Vdd) is applied to the even numbered data lines BL2, . . . BL (n+1).

In this case, when, in the first cell unit CELL1, the nonvolatile memory device MC12 is in the erase state and the nonvolatile memory device MC22 is in the write state, then the nonvolatile memory device MC12 is in the ON state and the nonvolatile memory device MC22 is in the OFF state.

When, in the n-th cell unit CELLn, the nonvolatile memory device MC12 is in the write state and the nonvolatile memory device MC22 is in the erase state, then the nonvolatile memory device MC12 is in the OFF state and the nonvolatile memory device MC22 is in the ON state.

As a result, the first potential is transferred from the first data line BL1 to the common node CN1 connected to the first cell unit CELL1. A second potential is transferred from the (n+1)-th data line BL (n+1) to the common node CNn connected to the n-th cell unit CELLn (transfer of the context).

In this example, the time t2 and the time t3 are separately set. However, both of them may be done with the same timing (both of them may be done at the same time).

At the time t4, for example, the control signal φpre is set at the ground potential Vss, and the precharge switch SW-pre2 is set in the OFF state.

As a result, the configuration output nodes OUT1, . . . OUTn are cut off from the precharge power supply line P—pre.

In this case, in this example, the time when the precharge switch SW-pre2 is changed to the OFF state (time t4) is after the transfer of the context (time t3).

At the time t5, for example, the control signal φAn is set at the power supply potential Vdd, and the control signal φAp is set at the ground potential Vss.

As a result, both of the power switch SW-power and the ground switch SW-ground are in the ON state, and the power supply, to the flip-flop circuits FF1, . . . FFn is started. In other words, the flip-flop circuits FF1, . . . FFn are activated.

Therefore, in the flip-flop circuit FF1 corresponding to the first cell unit CELL1, the common node CN1 is rapidly fixed to the "Low (Vss)" state, and the configuration data output node OUT1 is rapidly fixed to the "High (Vdd)" state.

In the flip-flop circuit FFn corresponding to the n-th cell unit CELLn, the common node CNn is rapidly fixed to the "High (Vdd)" state, and the configuration data output node OUTn is rapidly fixed to the "Low (Vss)" state.

More specifically, the output data DATA1 are fixed to the "High" state, and the output data DATAn are fixed to the "Low" state.

In this example, the time t4 and the time t5 are separately set. However, both of them may be done with the same timing (both of them may be done at the same time).

Start Processing

Subsequently, at the time t6, the FPGA operation is started. The FPGA operation is the same as the operation explained in the first modification, and therefore description thereabout is omitted.

In this example, the time t5 and the time t6 are separately set. However, both of them may be done with the same timing (both of them may be done at the same time).

According to this example, the circuit for assisting the transfer process from the nonvolatile memory device to the flip-flop circuit includes only the power switch SW-power, the ground switch SW-ground, and the precharge switch SW-pre2. Therefore, as compared with the first modification, there is an advantage in that there is a smaller overhead in the size of area due to the circuit for assisting the transfer process.

4. Fourth Modification

FIG. 12 illustrates the fourth modification of the configuration memory of FIG. 2. Like FIG. 2, FIG. 12 illustrates a state of the basic units during read operation. FIG. 13 is a waveform chart illustrating read operation.

First, a configuration of the configuration memory of the present example will be explained.

In the explanation below, however, elements different from the basic unit of FIG. 2 will be explained. The same elements as those of the basic unit of FIG. 2 are denoted with the same reference numerals, and detailed description thereabout is omitted.

The source terminals of P-channel type FETs P1, P2 in the flip-flop circuits FF1, . . . FFn are connected to a local power supply line P-local. The source terminals of N-channel type FETs N1, N2 in the flip-flop circuits FF1, . . . FFn are connected to a local ground line G-local.

On the other hand, a power supply potential Vdd is applied to the global power supply line P-global, and a ground potential Vss is applied to the global ground line G-global.

A power switch (for example, P-channel type FET) SW-power is connected between the global power supply line P-global and the local power supply line P-local. When the power switch SW-power is, for example, a P-channel type FET, a control signal φAp is input to the control terminal (gate terminal) of the power switch SW-power.

A ground switch (for example, N-channel type FET) SW-ground is connected between the global ground line G-global and the local ground line G-local. When the ground switch SW-ground is, for example, an N-channel type FET, a control signal φAn is input to the control terminal (gate terminal) of the ground switch SW-ground.

Further, an equalize switch (for example, N-channel type FET) SW-equal is connected between the common nodes CN1, . . . CNn and the configuration output nodes OUT1, . . . OUTn.

When the equalize switch SW-equal is, for example, an N-channel type FET, a control signal φpre is input to the control terminal (gate terminal) of the equalize switch SW-equal.

As compared with the first modification of FIG. 6, this example is characterized in that the first and second precharge switches SW-pre1, SW-pre2 are omitted.

Subsequently, basic operation of the configuration memory according to this example will be explained.

In the basic operation, write operation and erase operation are the same as those explained with reference to FIGS. 4 and 5, and therefore, description thereabout is omitted here.

In the explanation below, the read operation will be explained.

Like the first modification, a selected context has (n+1)/2 bits stored in (n+1) nonvolatile memory devices ((n+1)/2 memory pairs) connected to the second control line WL2. In this case, n is an odd number.

Configuration Memory Setup

First, setup operation is performed from times t1 to t6. The setup operation is as follows.

At the time t1, for example, the control signal φpre is set at the power supply potential Vdd, and the equalize switch SW-equal is set in the ON state.

As a result, the potentials of the common nodes CN1, . . . CNn and the potentials of the configuration output nodes OUT1, . . . OUTn are equalized to approximately Vdd/2.

At the time t2, for example, the control signal φAn is set at the ground potential Vss, and the control signal φAp is set at the power supply potential Vdd.

As a result, both of the power switch SW-power and the ground switch SW-ground are in the OFF state, so that the power supply to the flip-flop circuits FF1, . . . FFn is shut off. In other words, the flip-flop circuits FF1, . . . FFn are inactivated.

In this example, the time t1 and the time t2 are separately set. However, both of them may be done with the same timing (both of them may be done at the same time).

At the time t3, for example, the control signal φpre is set at the ground potential Vss, and the equalize switch SW-equal is set in the OFF state.

As a result, the common nodes CN1, . . . CNn and the configuration output nodes OUT1, . . . OUTn are cut from each other.

At the time t4, the select gate lines SGD, SGS are set at the ON potential Vsg-pass (for example, +4V), the unselected first and third control lines WL1, WL3 are set at the transfer potential Vpass, and the selected second control line WL2 is set at the read potential Vread.

A first potential (for example, ground potential Vss) is applied to the odd numbered data lines BL1, . . . BLn, and a second potential (for example, power supply potential Vdd) is applied to the even numbered data lines BL2, . . . BL (n+1).

In this case, when, in the first cell unit CELL1, the nonvolatile memory device MC12 is in the erase state and the nonvolatile memory device MC22 is in the write state, then the nonvolatile memory device MC12 is in the ON state and the nonvolatile memory device MC22 is in the OFF state.

When, in the n-th cell unit CELLn, the nonvolatile memory device MC12 is in the write state and the nonvolatile memory device MC22 is in the erase state, then the nonvolatile memory device MC12 is in the OFF state and the nonvolatile memory device MC22 is in the ON state.

As a result, the first potential is transferred from the first data line BL1 to the common node CN1 connected to the first cell unit CELL1. A second potential is transferred from the (n+1)-th data line BL (n+1) to the common node CNn connected to the n-th cell unit CELLn.

In this example, the time t3 and the time t4 are separately set. However, both of them may be done with the same timing (both of them may be done at the same time).

At the time t5, for example, the control signal φAn is set at the power supply potential Vdd, and the control signal φAp is set at the ground potential Vss.

As a result, both of the power switch SW-power and the ground switch SW-ground are in the ON state, and the power supply to the flip-flop circuits FF1, . . . FFn is started. In other words, the flip-flop circuits FF1, . . . FFn are activated.

Therefore, in the flip-flop circuit FF1 corresponding to the first cell unit CELL1, the common node CN1 is rapidly fixed to the "Low (Vss)" state, and the configuration data output node OUT1 is rapidly fixed to the "High (Vdd)" state.

In the flip-flop circuit FFn corresponding to the n-th cell unit CELLn, the common node CNn is rapidly fixed to the "High (Vdd)" state, and the configuration data output node OUTn is rapidly fixed to the "Low (Vss)" state.

More specifically, the output data DATA1 are fixed to the "High" state, and the output data DATAn are fixed to the "Low" state.

Start Processing

Subsequently, at the time t6, the FPGA operation is started. The FPGA operation is the same as the operation explained in the first modification, and therefore description thereabout is omitted.

In this example, the time t5 and the time t6 are separately set. However, both of them may be done with the same timing (both of them may be done at the same time).

Figure 23:
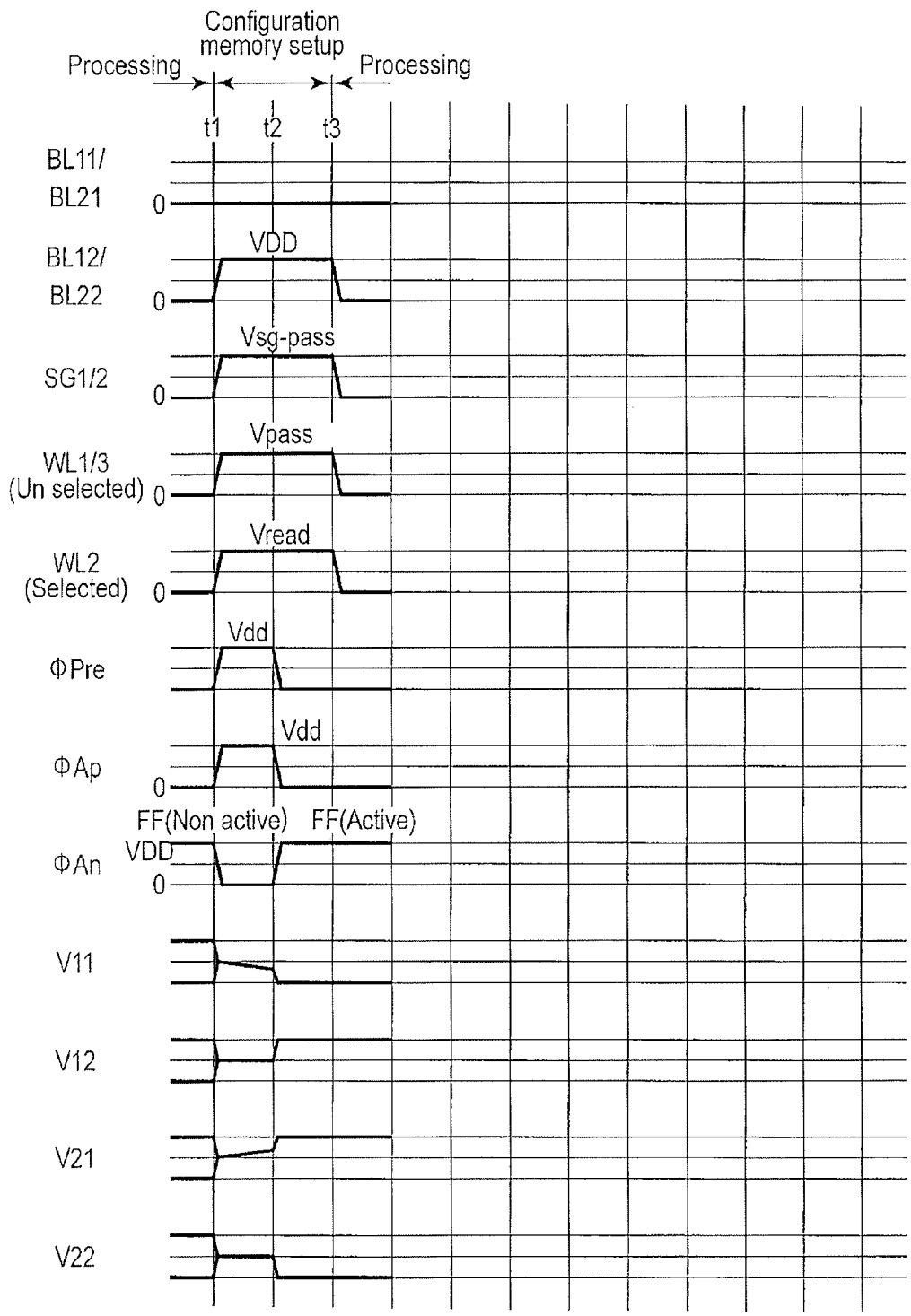
FIGS. 23 and 24 are waveform charts illustrating a modification of read operation.

Hereinafter, another read operation will be explained with reference to FIG. 23 (high-speed timing mode).

At the time t1, (1) For example, the control signal φpre is set at the power supply potential Vdd, and the equalize switch SW-equal is set in the ON state.

(2) For example, the control signal φAn is set at the ground potential Vss, the control signal φAp is set at the power supply potential Vdd, and the power supply to the flip-flop circuit FF is shut off.

(3) The select gate lines SGD, SGS are set at the ON potential Vsg-pass (for example, +4V), the unselected first and third control lines WL1, WL3 are set at the transfer potential Vpass, and the selected second control line WL2 is set at the read potential Vread. The first potential (for example, ground potential Vss) is applied to the odd numbered data lines BL1, . . . BLn, and the second potential (for example, power supply potential Vdd) is applied to the even numbered data lines BL2, . . . BL (n+1).

At the time t2, (1) For example, the control signal φpre is set at the ground potential Vss, and the equalize switch SW-equal is set in the OFF state.

(2) For example, the control signal φAn is set at the power supply potential Vdd, and the control signal φAp is set at the ground potential Vss.

At the time t3, the FPGA operation is started. The FPGA operation is the same as the operation explained in the first modification, and therefore description thereabout is omitted. In this example, the time t2 and the time t3 are separately set. However, both of them may be done with the same timing (both of them may be done at the same time).

According to this example, the circuit for assisting the transfer process from the nonvolatile memory device to the flip-flop circuit includes only the power switch SW-power, the ground switch SW-ground, and the equalize switch SW-equal. Therefore, as compared with the first modification, there is an advantage in that there is a smaller overhead in the size of area due to the circuit for assisting the transfer process.

5. Fifth Modification

Figure 15:
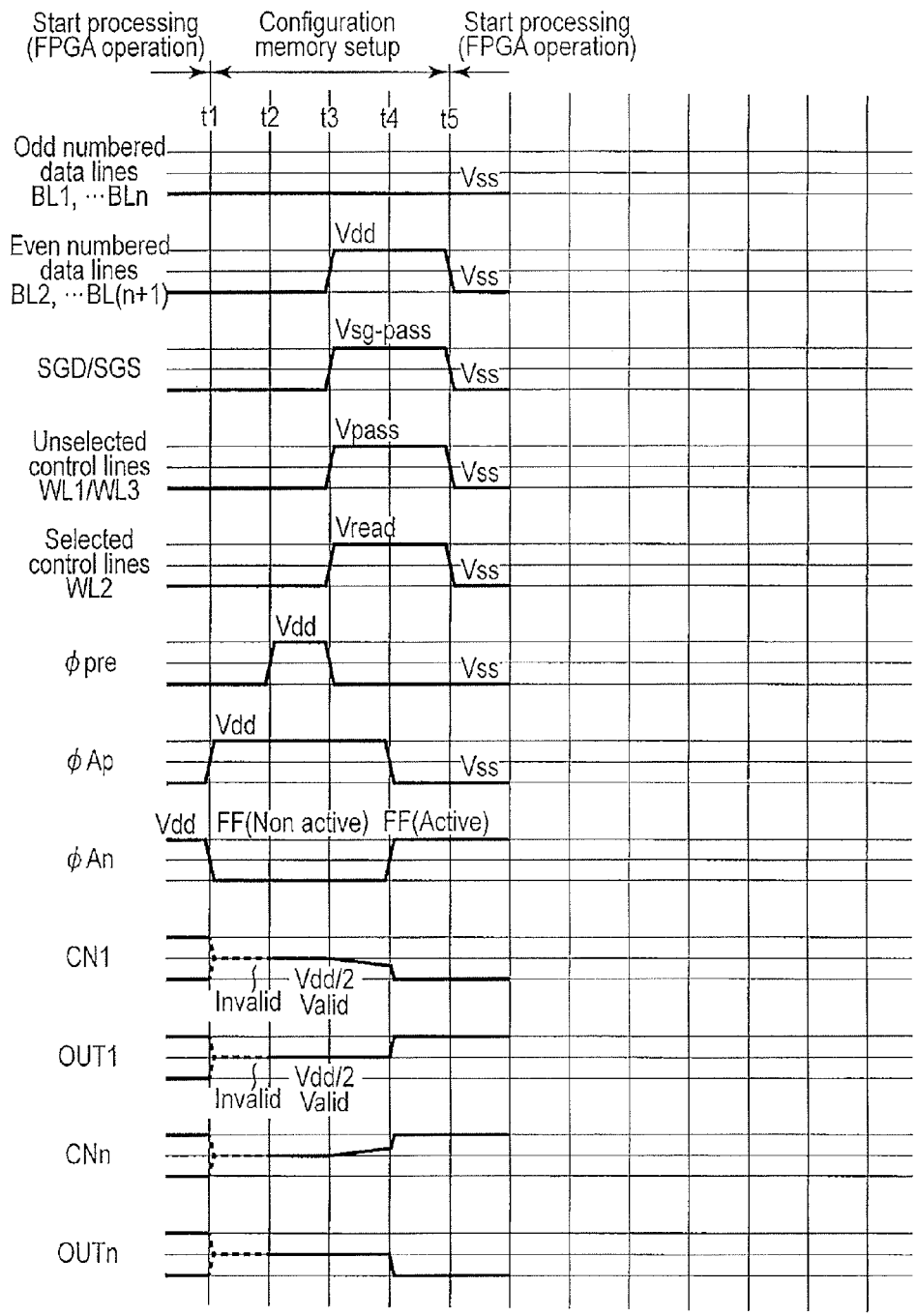
FIG. 15 is a waveform chart illustrating read operation of the circuit of FIG. 14.

FIG. 14 illustrates the fifth modification of the configuration memory of FIG. 2. Like FIG. 2, FIG. 14 illustrates a state of the basic units during read operation. FIG. 15 is a waveform chart illustrating read operation.

First, a configuration of the configuration memory of the present example will be explained.

In the explanation below, however, elements different from the basic unit of FIG. 2 will be explained. The same elements as those of the basic unit of FIG. 2 are denoted with the same reference numerals, and detailed description thereabout is omitted.

The source terminals of P-channel type FETs P1, P2 in the flip-flop circuits FF1, . . . FFn are connected to a local power supply line P-local. The source terminals of N-channel type FETs N1, N2 in the flip-flop circuits FF1, . . . FFn are connected to a local ground line G-local.

On the other hand, a power supply potential Vdd is applied to the global power supply line P-global, and a ground potential Vss is applied to the global ground line G-global.

A power switch (for example, P-channel type PET) SW-power is connected between the global power supply line P-global and the local power supply line P-local. When the power switch SW-power is, for example, a P-channel type FET, a control signal φAp is input to the control terminal (gate terminal) of the power switch SW-power.

A ground switch (for example, N-channel type FET) SW-ground is connected between the global ground line G-global and the local ground line G-local. When the ground switch SW-ground is, for example, an N-channel type FET, a control signal φAn is input to the control terminal (gate terminal) of the ground switch SW-ground.

An equalize switch (for example, a CMOS transfer gate including a P-channel type FET and an N-channel type FET) SW-pg is connected between the local power supply line P-local and the local ground line G-local.

The N-channel type FET is suitable for transferring the ground potential. On the other hand, the P-channel type FET is suitable for transferring the power supply potential. When the CMOS transfer gate is used, the potentials of the local power supply line P-local and the local ground line G-local can be set at the same level with a higher degree of accuracy.

When the equalize switch SW-pg is, for example, the CMOS transfer gate including the P-channel type FET and the N-channel type FET, control signals φpre, bφpre are input to the control terminal (gate terminal) of the equalize switch SW-pg.

It should be noted that the equalize switch SW-pg may be made of only the P-channel type FET, or may be made of only the N-channel type FET.

Subsequently, basic operation of the configuration memory according to this example will be explained.

In the basic operation, write operation and erase operation are the same as those explained with reference to FIGS. 4 and 5, and therefore, description thereabout is omitted here.

In the explanation below, the read operation will be explained.

Like the first modification, a selected context has $(n+1)/2$ bits stored in $(n+1)$ nonvolatile memory devices ($(n+1)/2$ memory pairs) connected to the second control line WL2. In this case, n is an odd number.

Configuration Memory Setup

First, setup operation is performed from times t1 to t5. The setup operation is as follows.

At the time t1, for example, the control signal φAn is set at the ground potential Vss, and the control signal φAp is set at the power supply potential Vdd.

As a result, both of the power switch SW-power and the ground switch SW-ground are in the OFF state, so that the power supply to the flip-flop circuits FF1, . . . FFn is shut off. In other words, the flip-flop circuits FF1, . . . FFn are inactivated.

At the time t2, for example, the control signal φpre is set at the power supply potential Vdd, the control signal bφpre is set at the ground potential Vss, and the equalize switch SW-pg is set in the ON state.

As a result, the potential of the local power supply line P-local and the potential of the local ground line G-local are equalized to Vdd/2. In addition, as a result, the potentials of the common node CN1 and the OUT1 have values close to Vdd/2.

In this example, the time t1 and the time t2 are separately set. However, both of them may be done with the same timing (both of them may be done at the same time).

At the time t3, for example, the control signal φpre is set at the ground potential Vss, the control signal bφpre is set at the power supply potential Vdd, and the equalize switch SW-pg is set in the OFF state.

As a result, the local power supply line P-local and the local ground line G-local are electrically separated from each other.

In addition, at the time t3, the select gate lines SGD, SGS are set at the ON potential Vsg-pass (for example, +4V), the unselected first and third control lines WL1, WL3 are set at the transfer potential Vpass, and the selected second control line WL2 is set at the read potential Vread.

A first potential (for example, ground potential Vss) is applied to the odd numbered data lines BL1, . . . BLn, and a second potential (for example, power supply potential Vdd) is applied to the even numbered data lines BL2, . . . BL (n+1).

In this case, when, in the first cell unit CELL1, the nonvolatile memory device MC12 is in the erase state and the nonvolatile memory device MC22 is in the write state, then the nonvolatile memory device MC12 is in the ON state and the nonvolatile memory device MC22 is in the OFF state.

When, in the n-th cell unit CELLn, the nonvolatile memory device MC12 is in the write state and the nonvolatile memory device MC22 is in the erase state, then the nonvolatile memory device MC12 is in the OFF state and the nonvolatile memory device MC22 is in the ON state.

As a result, the first potential is transferred from the first data line BL1 to the common node CN1 connected to the first cell unit CELL1. The second potential is transferred from the (n+1)-th data line BL (n+1) to the common node CNn connected to the n-th cell unit CELLn.

At the time t4, for example, the control signal φAn is set at the power supply potential Vdd, and the control signal φAp is set at the ground potential Vss.

As a result, both of the power switch SW-power and the ground switch SW-ground are in the ON state, and the power supply to the flip-flop circuits FF1, . . . FFn is started. In other words, the flip-flop circuits FF1, . . . FFn are activated.

Therefore, in the flip-flop circuit FF1 corresponding to the first cell unit CELL1, the common node CN1 is rapidly fixed to the "Low (Vss)" state, and the configuration data output node OUT1 is rapidly fixed to the "High (Vdd)" state.

In the flip-flop circuit FFn corresponding to the n-th cell unit CELLn, the common node CNn is rapidly fixed to the "High (Vdd)" state, and the configuration data output node OUTn is rapidly fixed to the "Low (Vss)" state.

More specifically, the output data DATA1 are fixed to the "High" state, and the output data DATAn are fixed to the "Low" state.

Start Processing

Subsequently, at the time t5, the FPGA operation is started. The FPGA operation is the same as the operation explained in the first modification, and therefore description thereabout is omitted.

In this example, the time t4 and the time t5 are separately set. However, both of them may be done with the same timing (both of them may be done at the same time).

Figure 24:
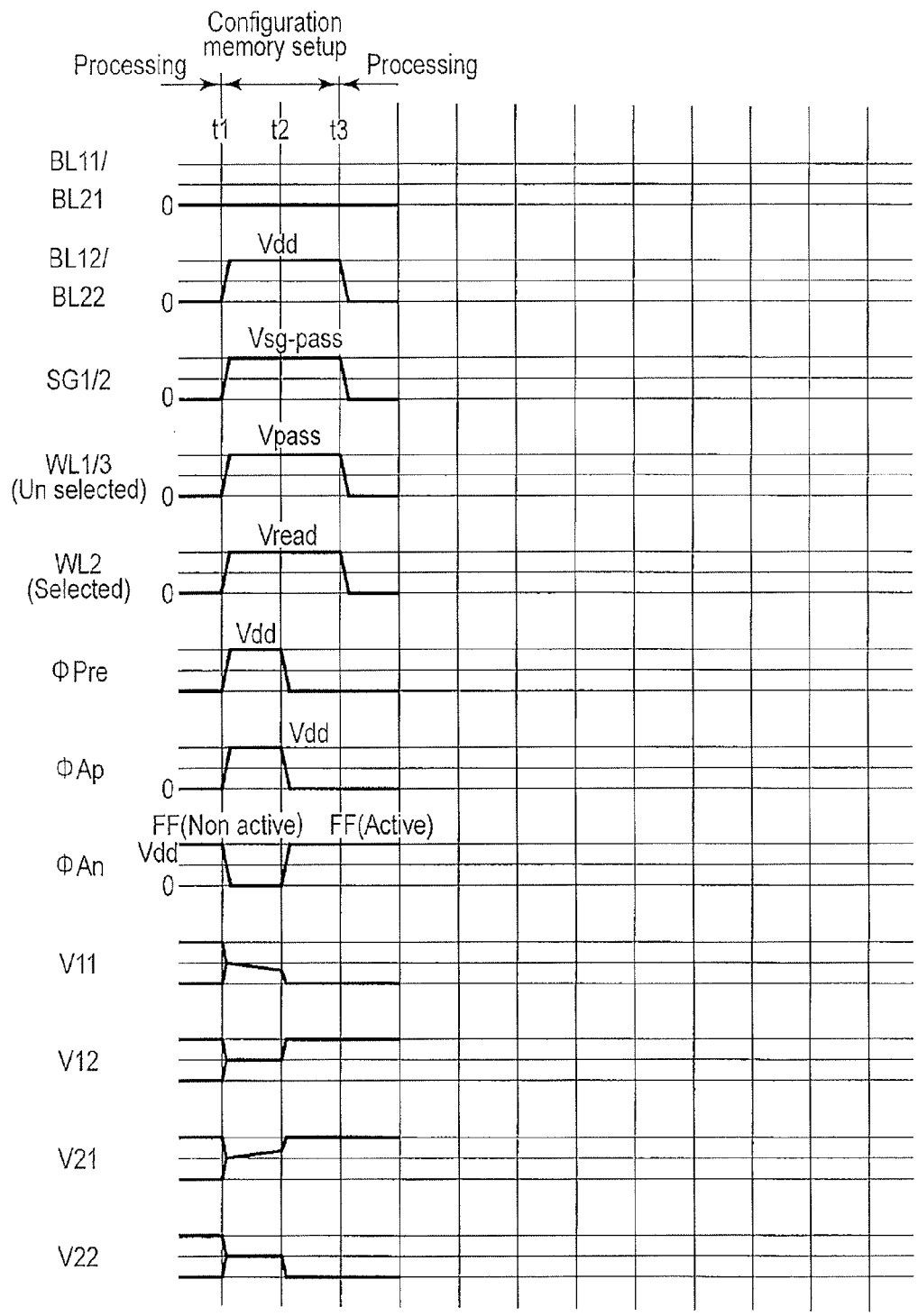

Hereinafter, another read operation will be explained with reference to FIG. 24 (high-speed timing mode).

At the time t1, (1) For example, the control signal pre is set at the power supply potential Vdd, the control signal bφpre is set at the ground potential Vss, and the equalize switch SW-pg is set in the ON state.

(2) For example, the control signal φAn is set at the ground potential Vss, the control signal φAp is set at the power supply potential Vdd, and the power supply to the flip-flop circuit FF is shut off.

(3) The select gate lines SGD, SGS are set at the ON potential Vsg-pass (for example, +4V), the unselected first and third control lines WL1, WL3 are set at the transfer potential Vpass, and the selected second control line WL2 is set at the read potential Vread. The first potential (for example, ground potential Vss) is applied to the odd numbered data lines BL1, . . . BLn, and the second potential (for example, power supply potential Vdd) is applied to the even numbered data lines BL2, . . . BL (n+1).

At the time t2, (1) For example, the control signal φpre is set at the ground potential Vss, the control signal bφpre is set at the power supply potential Vdd, and the equalize switch SW-pg is set in the OFF state.

(2) For example, the control signal φAn is set at the power supply potential Vdd, and the control signal φAp is set at the ground potential Vss.

At the time t3, the FPGA operation is started. The FPGA operation is the same as the operation explained in the first modification, and therefore description thereabout is omitted. In this example, the time t2 and the time t3 are separately set. However, both of them may be done with the same timing (both of them may be done at the same time).

According to this example, the circuit for assisting the transfer process from the nonvolatile memory device to the flip-flop circuit includes only the power switch SW-power, the ground switch SW-ground, and the equalize switch SW-pg, and furthermore, they can be shared by all the flip-flop circuits FF1, . . . FFn. Therefore, as compared with the first modification, there is an advantage in that there is a smaller overhead in the size of area due to the circuit for assisting the transfer process.

6. Sixth Modification

Figure 16:
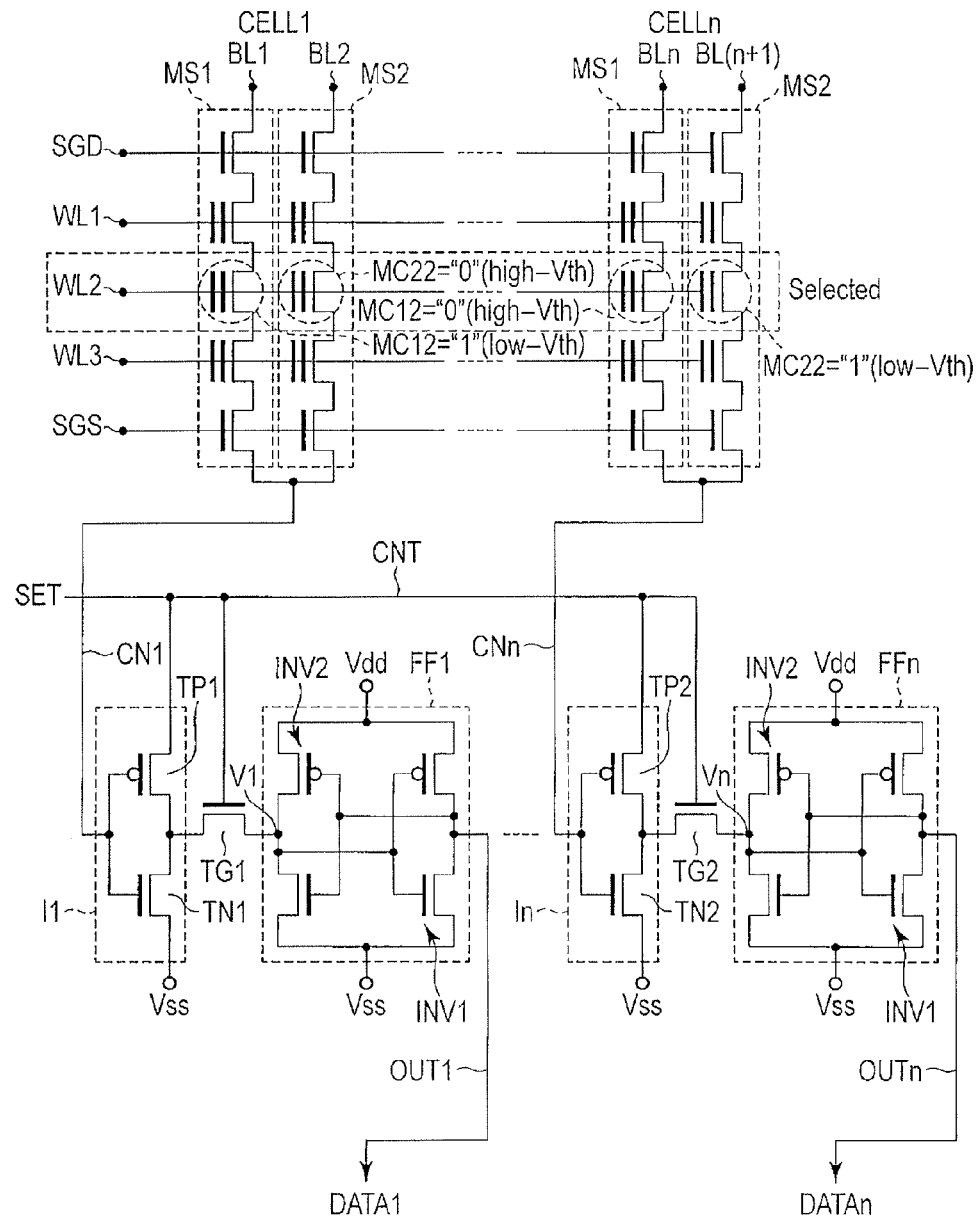
FIG. 16 is a circuit diagram illustrating a sixth modification.
Figure 17:
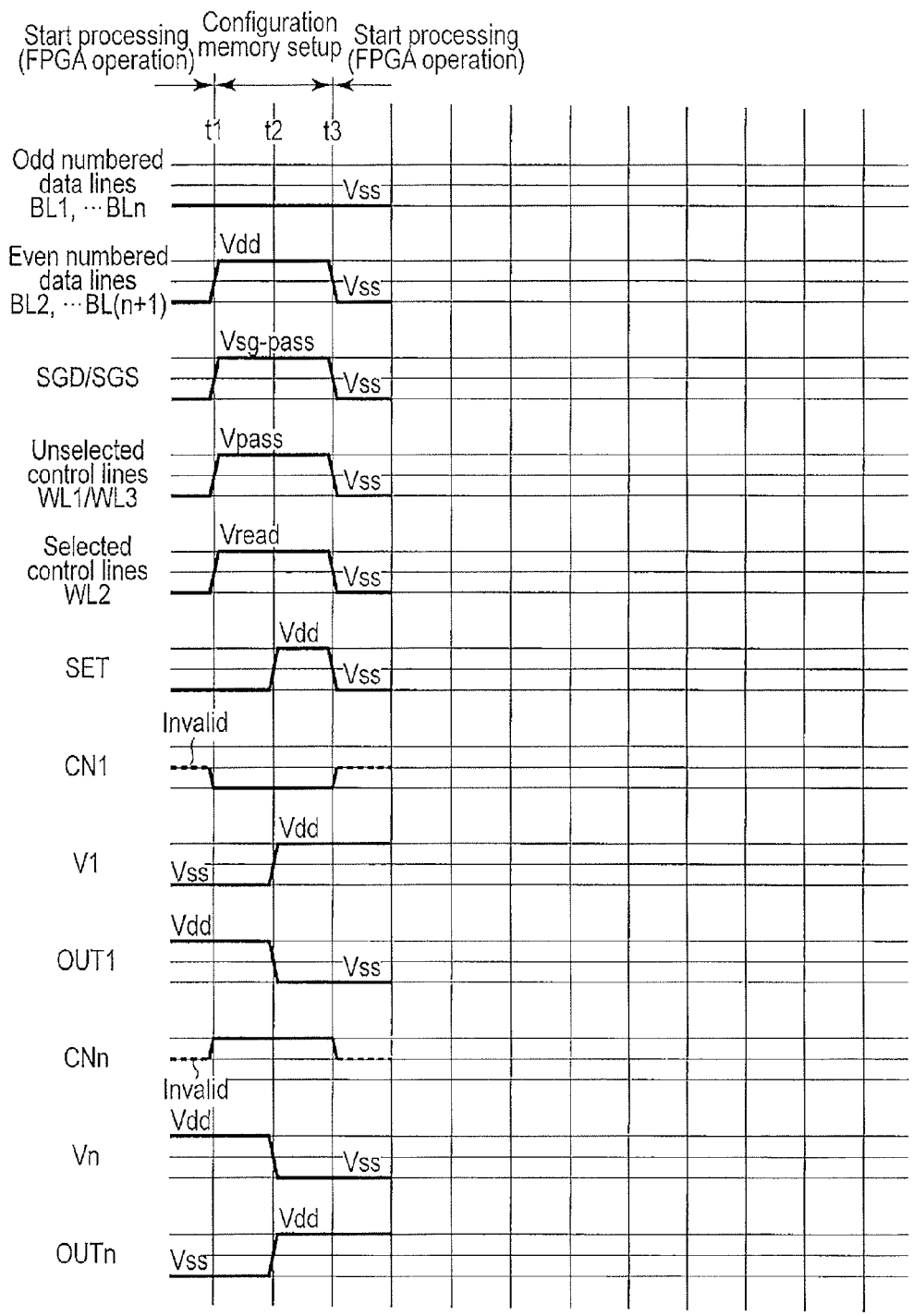
FIG. 17 is a waveform chart illustrating read operation of the circuit of FIG. 16.

FIG. 16 illustrates the sixth modification of the configuration memory of FIG. 2. Like FIG. 2, FIG. 16 illustrates a state of the basic units during read operation. FIG. 17 is a waveform chart illustrating read operation.

First, a configuration of the configuration memory of the present example will be explained.

In the explanation below, however, elements different from the basic unit of FIG. 2 will be explained. The same elements as those of the basic unit of FIG. 2 are denoted with the same reference numerals, and detailed description thereabout is omitted.

A common node CN1 of a cell unit CELL1 is connected to an input terminal of an inverter I1. An output terminal of the inverter I1 is connected via a transfer gate (for example, N-channel type FET) TG1 to an input node V1 of a flip-flop circuit FF1.

Likewise, a common node CNn of a cell unit CELLn is connected to an input terminal of an inverter In. An output terminal of the inverter In is connected via a transfer gate (for example, N-channel type FET) TGn to an input node Vn of a flip-flop circuit FFn.

The inverter I1 includes a P-channel type FET TP1 and an N-channel type FET TN1, which are connected in series between the control line CNT and the ground line Vss. The inverter In includes a P-channel type FET TPn and an N-channel type FET TNn, which are connected in series between the control line CNT and the ground line Vss.

A control signal SET is applied to the control line CNT. When the transfer gates TG1, . . . TGn are, for example, N-channel type FETs, a control signal SET is input to control terminals (gate terminals) of the transfer gates TG1, . . . TGn.

Subsequently, basic operation of the configuration memory according to this example will be explained.

In the basic operation, write operation and erase operation are the same as those explained with reference to FIGS. 4 and 5, and therefore, description thereabout is omitted here.

In the explanation below, the read operation will be explained.

Like the first modification, a selected context has (n+1)/2 bits stored in (n+1) nonvolatile memory devices ((n+1)/2 memory pairs) connected to the second control line WL2. In this case, n is an odd number.

Configuration Memory Setup

First, setup operation is performed from times t1 to t3. The setup operation is as follows.

At the time t1, the select gate lines SGD, SGS are set at the ON potential Vsg-pass (for example, +4V), the unselected first and third control lines WL1, WL3 are set at the transfer potential Vpass, and the selected second control line WL2 is set at the read potential Vread.

A first potential (for example, ground potential Vss) is applied to the odd numbered data lines BL1, . . . BLn, and a second potential (for example, power supply potential Vdd) is applied to the even numbered data lines BL2, . . . BL (n+1).

In this case, when, in the first cell unit CELL1, the nonvolatile memory device MC12 is in the erase state and the nonvolatile memory device MC22 is in the write state, then the nonvolatile memory device MC12 is in the ON state and the nonvolatile memory device MC22 is in the OFF state.

When, in the n-th cell unit CELLn, the nonvolatile memory device MC12 is in the write state and the nonvolatile memory device MC22 is in the erase state, then the nonvolatile memory device MC12 is in the OFF state and the nonvolatile memory device MC22 is in the ON state.

As a result, the first potential is transferred from the first data line BL1 to the common node CN1 connected to the first cell unit CELL1. The second potential is transferred from the (n+1)-th data line BL (n+1) to the common node CNn connected to the n-th cell unit CELLn.

At the time t2, for example, the control signal SET is set at the power supply potential Vdd.

As a result, the transfer gates TG1, . . . TGn are in the ON state, and the potentials of the common nodes CN1, . . . CNn (context data) are inverted by the inverters. Thereafter, the inverted potentials are transferred via the transfer gates TG1, . . . TGn to the flip-flop circuits FF1, . . . FFn.

In this case, the inverters I1, . . . In have a function of assisting transfer process of the context data, which have been read out to the common nodes CN1, . . . CNn, to the flip-flop circuits FF1, . . . FFn.

Therefore, in the flip-flop circuit FF1 corresponding to the first cell unit CELL1, the input node V1 is rapidly fixed to the "High (Vdd)" state, and the configuration data output node OUT1 is rapidly fixed to the "Low (Vss)" state.

In the flip-flop circuit FFn corresponding to the n-th cell unit CELLn, the input node Vn is rapidly fixed to the "Low (Vss)" state, and the configuration data output node OUTn is rapidly fixed to the "High (Vdd)" state.

More specifically, the output data DATA1 are fixed to the "Low" state, and the output data DATAn are fixed to the "High" state.

In this example, the time t1 and the time t2 are separately set. However, both of them may be done with the same timing (both of them may be done at the same time).

Start Processing

Subsequently, at a time t3, FPGA operation is started. The FPGA operation is the same as the operation explained in the first modification except that, for example, the control signal SET is set at VSS, and therefore description thereabout is omitted.

According to this example, the circuit for assisting the transfer process from the nonvolatile memory device to the flip-flop circuit includes the inverters I1, . . . In and the transfer gates TG1, . . . TGn. Therefore, as compared with the first modification, there is an advantage in that there is a smaller overhead in the size of area due to the circuit for assisting the transfer process.

In this example, the nonvolatile memory device may charge the input nodes of the inverters (write-assisting inverters) I1, . . . In to the power supply potential Vdd, or may discharge the input nodes of the inverters (write-assisting inverters) I1, . . . In to the ground potential Vss. In other words, the size of the nonvolatile memory device can be determined regardless of the drive current of the flip-flop circuit.

However, the drive current of the inverters I1, . . . In need to be at a magnitude large enough to invert data held in the flip-flop circuit.

7. Seventh Modification

Figure 19:
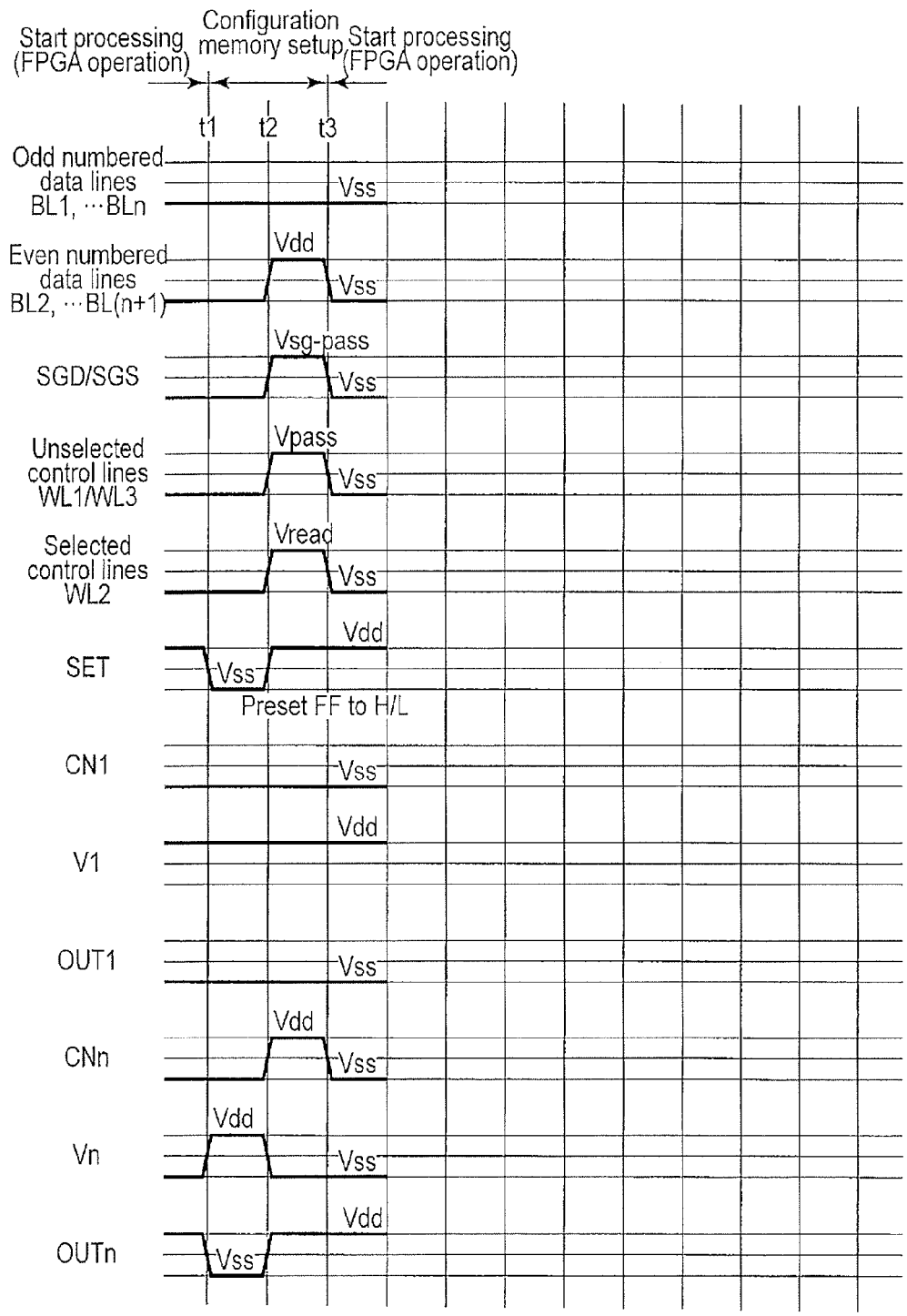
FIG. 19 is a waveform chart illustrating read operation of the circuit of FIG. 18.

FIG. 18 illustrates the seventh modification of the configuration memory of FIG. 2. Like FIG. 2, FIG. 18 illustrates a state of the basic units during read operation. FIG. 19 is a waveform chart illustrating read operation.

First, a configuration of the configuration memory of the present example will be explained.

In the explanation below, however, elements different from the basic unit of FIG. 2 will be explained. The same elements as those of the basic unit of FIG. 2 are denoted with the same reference numerals, and detailed description thereabout is omitted.

For a flip-flop circuit FF1, further, a P-channel type FET TP1 and an N-channel type FET TN1 are connected in series between a power supply node Vdd and a ground node Vss. These FETs TP1, TN1 makes a write buffer (B1) for the flip-flop circuit FF1.

A common node CN1 is connected to a gate terminal of the N-channel type FET TN1, and a control line CNT is connected to a gate terminal of the P-channel type FET TP1. A drain terminal of the P-channel type FET TP1 and a drain terminal of the N-channel type FET TN1 are connected to an input node V1 of the flip-flop circuit FF1.

For a flip-flop circuit FFn, further, a P-channel type FET TPn and an N-channel type FET TNn are connected in series between the power supply node Vdd and the ground node Vss. These FETs TPn, TNn make a write buffer (Bn) for the flip-flop circuit FFn.

The common node CNn is connected to a gate terminal of the N-channel type FET TNn, and the control line CNT is connected to a gate terminal of the P-channel type FET TPn. A drain terminal of the P-channel type FET TPn and a drain terminal of the N-channel type FET TNn are connected to an input node Vn of the flip-flop circuit FFn.

A control signal SET is applied to the control line CNT.

Subsequently, basic operation of the configuration memory according to this example will be explained.

In the basic operation, write operation and erase operation are the same as those explained with reference to FIGS. 4 and 5, and therefore, description thereabout is omitted here.

In the explanation below, the read operation will be explained.

Like the first modification, a selected context has (n+1)/2 bits stored in (n+1) nonvolatile memory devices ((n+1)/2 memory pairs) connected to the second control line WL2. In this case, n is an odd number.

Configuration Memory Setup

First, setup operation is performed from times t1 to t3. The setup operation is as follows.

At the time t1, for example, the control signal SET is set at the ground potential Vss.

As a result, the P-channel type FETS TP1, . . . TPn are in the ON state, and the outputs of the write buffers B1, . . . Bn are at the power supply potential Vdd.

Accordingly, regardless of the held data in the past, input nodes V1, Vn of the flip-flop circuits FF1, . . . FFn are forcibly preset to the power supply potential Vdd.

At the time t2, for example, the control signal SET is set at the power supply potential Vdd. As a result, the P-channel type FETS TP1, . . . TPn are in the OFF state.

At the time t2, the select gate lines SGD, SGS are set at the ON potential Vsg-pass (for example, +4V), the unselected first and third control lines WL1, WL3 are set at the transfer potential Vpass, and the selected second control line WL2 is set at the read potential Vread.

A first potential (for example, ground potential Vss) is applied to the odd numbered data lines BL1, BLn, and a second potential (for example, power supply potential Vdd) is applied to the even numbered data lines BL2, . . . BL (n+1).

In this case, when, in the first cell unit CELL1, the nonvolatile memory device MC12 is in the erase state and the nonvolatile memory device MC22 is in the write state, then the nonvolatile memory device MC12 is in the ON state and the nonvolatile memory device MC22 is in the OFF state.

When, in the n-th cell unit CELLn, the nonvolatile memory device MC12 is in the write state and the nonvolatile memory device MC22 is in the erase state, then the nonvolatile memory device MC12 is in the OFF state and the nonvolatile memory device MC22 is in the ON state.

As a result, the first potential is transferred from the first data line BL1 to the common node CN1 connected to the first cell unit CELL1.

When the first potential is the ground potential Vss, the N-channel type FET TN1 in the write buffer B1 is in the OFF state, and therefore, the input node V1 of the flip-flop circuit FF1 is still at the power supply potential Vdd.

Therefore, in the flip-flop circuit FF1 corresponding to the first cell unit CELL1, the input node V1 keeps the "High (Vdd)" state, and the configuration data output node OUT1 keeps the "Low (Vss)" state.

On the other hand, the second potential is transferred from the second data line BL (n+1) to the common node CNn connected to the n-th cell unit CELLn.

When the second potential is at the power supply potential Vdd, the N-channel type FET TNn in the write buffer Bn is in the ON state, the input node Vn of the flip-flop circuit FF1 changes from the power supply potential Vdd to the ground potential Vss.

Therefore, in the flip-flop circuit FFn corresponding to the n-th cell unit CELLn, the input node Vn changes to the "Low (Vss)" state, and the configuration data output node OUTn changes to the "High (Vdd)" state.

More specifically, the output data DATA1 are fixed to the "Low" state, and the output data DATAn are fixed to the "High" state.

Start Processing

Subsequently, at the time t3, the FPGA operation is started. The FPGA operation is the same as the operation explained in the first modification, and therefore description thereabout is omitted.

According to this example, the circuit for assisting the transfer process from the nonvolatile memory device to the flip-flop circuit includes only the write buffers B1, . . . Bn. Therefore, as compared with the first modification, there is an advantage in that there is a smaller overhead in the size of area due to the circuit for assisting the transfer process.

Example of Application

Figure 21:
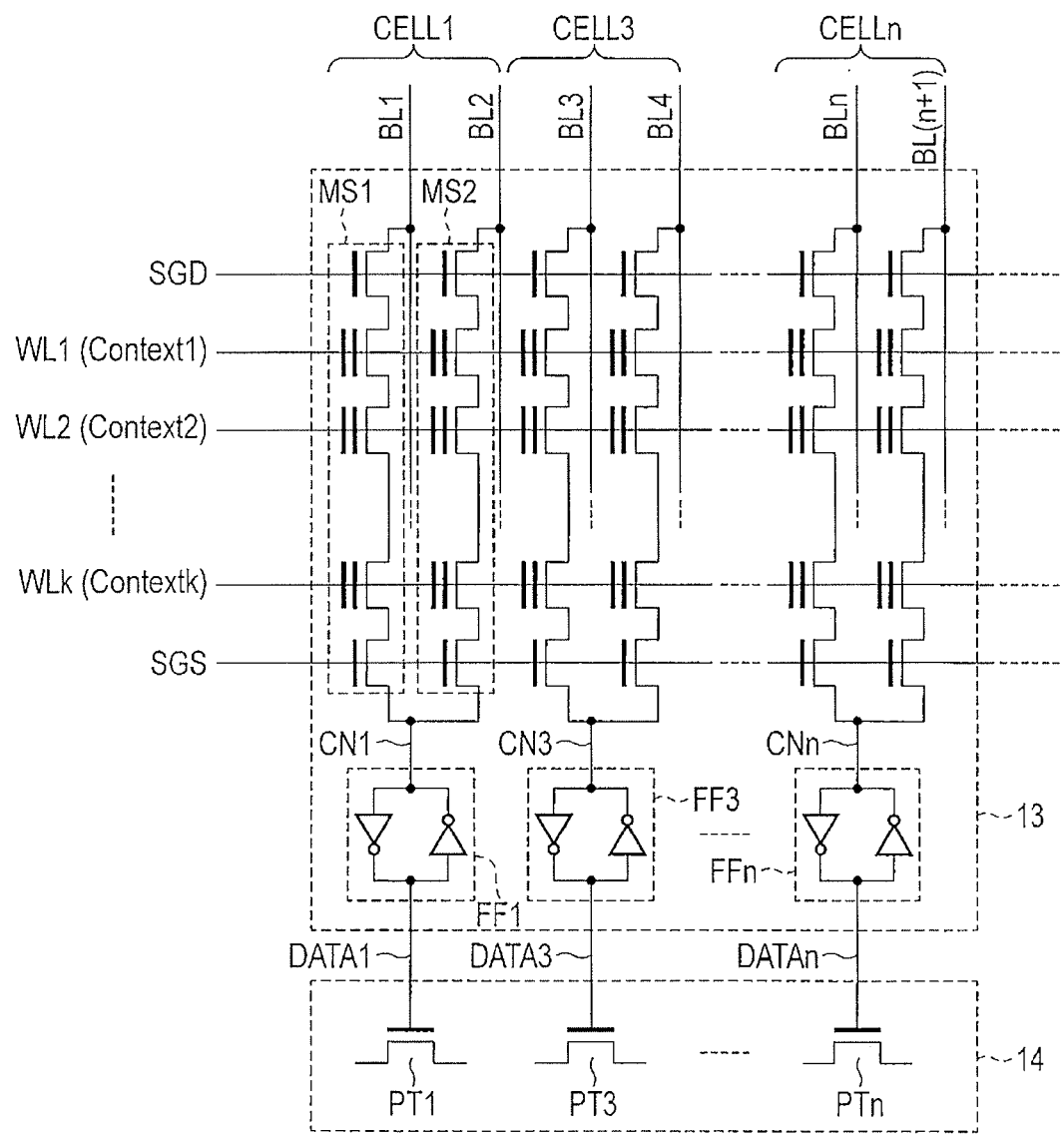
FIG. 21 is a circuit diagram illustrating a memory section and a logic circuit section of FIG. 20.

FIGS. 20 and 21 illustrate an FPGA as an example of application.

The same elements of the FPGA according to this example are denoted with the same reference numerals as the basic units according to the above embodiments, so as to clarify correspondence between this example and the above embodiments.

An FPGA 20 according to this example includes a plurality of blocks BLK11, . . . BLKij arranged in an array form (each of i and j is a natural number of 2 or more) and drivers 11, 12 for driving the blocks BLK11, . . . BLKij.

For example, a driver 11 selects any one of a plurality of word lines WL1, . . . WLk (k is a natural number of 2 or more) in a plurality of blocks BLK11, BLK12, . . . BLK1j arranged in a row direction, based on a context ID, and executes writing and reading of the context to/from a memory pair connected the selected word line.

For example, the driver 12 determines the potentials of the plurality of bit lines BL1, . . . BL (n+1), based on the operation/context information during write/read/erase operations.

Each of the blocks BLK11, . . . BLKij includes a memory section 13 and a logic circuit section 14.

The memory section 13 includes memory strings (memory pairs) according to the above embodiments. The logic circuit section 14 includes, for example, a look-up table, a pass transistor, and the like, and executes predetermined logic (circuit configuration) based on the output data DATA1, . . . DATAn which are output from the memory section 13.

For example, when a word line WL1 is selected during read operation, a context (Context 1) is read from the memory section 13 as output data DATA1, DATAn. The logic circuit section 14 performs processing to create output data Dout from input data Din0, Din1, Din2, . . . according to a logic predetermined based on the context (Context 1) from the memory unit 13.

In the example of FIG. 21, the output data DATA1, . . . DATAn are connected to control terminals of pass transistors PT1, PT2, . . . PTn (for example, gate terminals of FETs). The pass transistors play a role of selectively connecting, with each other, logic elements for achieving predetermined logic (circuit configuration).

In some cases, the output data DATA1, . . . DATAn may be input to the input nodes of inverters, the input terminals of switch transistors (for example, the source/drain of FET), and the like.

(Modification of Memory Array)

In the above basic units (embodiments) and the modifications thereof, the memory or the memory array constituting the configuration memory has a NAND structure.

In contrast, in the explanation about this modification, a memory or a memory array constituting the configuration memory has a NOR structure.

FIG. 25 illustrates a configuration memory.

The flip-flops FF and the circuit for controlling operation thereof are the same as the fifth modification (FIG. 14), and description thereabout is omitted here. This portion may be replaced with any circuit of all the embodiments described above other than the circuit of the fifth modification. More specifically, the flip-flops FF and the circuit for controlling operation thereof may be selected and employed from among the circuits of the above embodiments as necessary.

The cell unit CELL1 includes data lines BL1, . . . BL2. Likewise, the cell unit CELLn includes data lines BLn, BL (n+1). The control lines WL1, WL2, WL3 cross the data lines BL1, BL2, . . . BLn, BL (n+1).

A memory pair MP1 includes a nonvolatile memory device MC11 and a nonvolatile memory device MC12. In the nonvolatile memory device MC11, the gate terminal is connected to the control line WL1, the drain terminal is connected the data line BL1, and the source terminal is connected to the common node CN1. In the nonvolatile memory device MC12, the gate terminal is connected to the control line WL1, the drain terminal is connected to the data line BL2, and the source terminal is connected to the common node CN1.

A memory pair MP2 includes a nonvolatile memory device MC21 and a nonvolatile memory device MC22. In the nonvolatile memory device MC21, the gate terminal is connected to the control line WL2, the drain terminal is connected to the data line BL1, and the source terminal is connected to the common node CN1. In the nonvolatile memory device MC22, the gate terminal is connected to the control line WL2, the drain terminal is connected to the data line BL2, and the source terminal is connected to the common node CN1.

The memory pair MP3 includes a nonvolatile memory device MC31 and a nonvolatile memory device MC32. In the nonvolatile memory device MC31, the gate terminal is connected to the control line WL3, the drain terminal is connected to the data line BL1, and the source terminal is connected to the common node CN1. In the nonvolatile memory device MC32, the gate terminal is connected to the control line WL3, the drain terminal is connected to the data line BL2, the source terminal is connected to the common node CN1.

One bit of configuration data is stored in one memory pair. When the memory pair MP2 stores configuration data "0", for example, the threshold value of the nonvolatile memory device MC21 is set at the low-Vth, and the threshold value of the nonvolatile memory device MC22 is set at the high-Vth. When configuration data "1" is stored, for example, the threshold value of the nonvolatile memory device MC21 is set at the high-Vth, and the threshold value of the nonvolatile memory device MC22 is set at the low-Vth.

For example, one context is stored in n memory pairs connected to one control line. In this case, the context includes n bits of configuration data.

In this example, three control lines WL1, WL2, WL3 are shown, and in this case, the multi-context reconfigurable configuration memory capable of storing three contexts can be achieved.

For example, when the memory pair MP2 is selected during read operation (during switching of context), Vread is applied to the control line WL2, and the first and second voltages are applied to the data lines BL1, BL2. As a result, one bit of configuration data stored in the two nonvolatile memory devices MC21, MC22 in the memory pair MP2 is transferred to the flip-flop circuit FF.

When the context is switched, an OFF potential Voff lower than the threshold value (low-Vth) in the erase state is applied to the control lines WL1, WL3 in the unselected memory pair MP1, MP3. In contrast, in the case of the NAND structure of FIG. 14, Vpass is applied to the unselected control lines. Therefore, as compared with the NAND structure as described above, the memory array (NOR structure) according to this example is advantageous in that it is less likely to cause read disturb at the time of the switching of the context.

In the memory array of this example, it is not necessary to provide any select gate transistor in the cell unit, and therefore, the memory array of this example is more preferable than the NAND structure from the perspective of the number of transistors.

However, as compared with the NAND structure, the NOR structure has a larger number of via contacts, and this increases the size of area of one nonvolatile memory transistor. Whether the NAND structure is employed or the NOR structure is employed is preferably determined based on the size of the entire memory array including the transistors and the vias.

(Operation Timing Chart)

Figure 26:
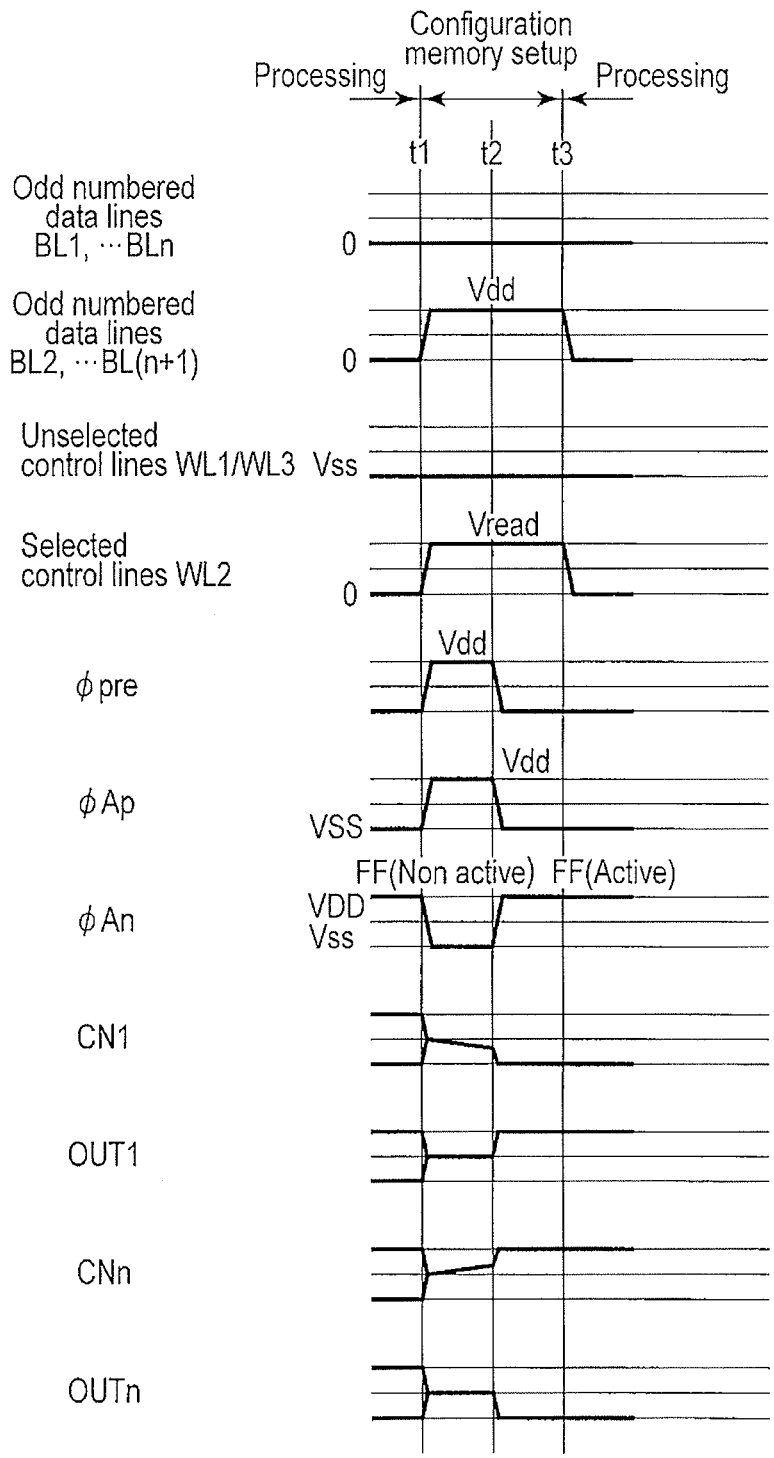
FIG. 26 is a waveform chart illustrating read operation of the circuit of FIG. 25.

FIG. 26 illustrates a timing chart during read operation of the memory of FIG. 25.

This timing chart is different from the timing chart according to the fifth modification (FIG. 24) in the following features.

First, this timing chart is different from the timing chart according to the fifth modification (FIG. 24) in that the potentials of the unselected control lines WL1/WL3 during reading are Voff.

As described above, this Voff is a potential which always makes the nonvolatile memory device in the OFF state regardless of the threshold value state of the nonvolatile memory device, and which is a potential still lower than the threshold value (low-Vth) in the erase state.

In the case of the NAND structure of FIG. 14, Vpass is applied to the unselected control lines.

Secondly, in the NOR structure, there is no select gate transistor, and accordingly, there is no timing chart for select gate line.

Except the above feature, this is the same as the timing chart of the fifth modification (FIG. 24), and therefore, description thereabout is omitted.

(Write)

Figure 27:
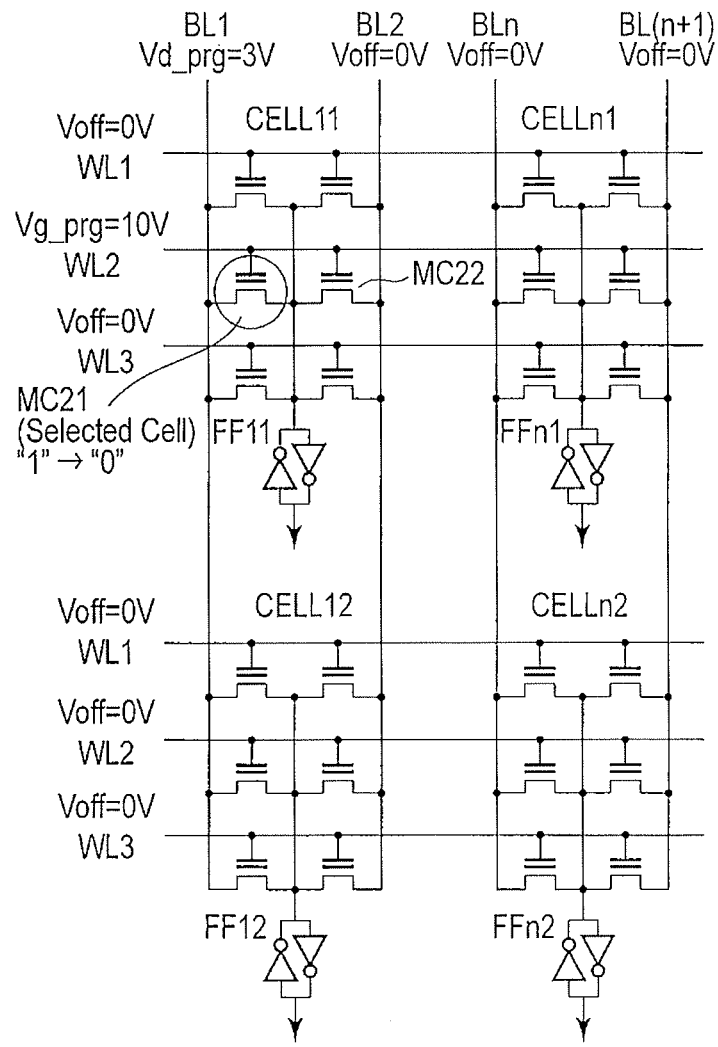
FIG. 27 is a figure illustrating a memory array during write operation.

FIG. 27 illustrates potential relationship of the memory of FIG. 25 during write operation.

Regarding the write mechanism, the NOR type employs Channel Hot Electron injection method (CHE method). In contrast, the NAND type employs Fowler-Nordheim tunnel current method (FN method).

Due to this difference of mechanism, the NOR type memory array is set as follows.

(1) The unselected control line is set at Voff (for example, 0V).

(2) The selected control line is set at Vgprg (for example, 10V). Vgprg is a potential lower than Vprg of the NAND structure.

(3) The unselected data line is set at Voff (for example, 0V).

(4) The selected data line is set at Vdprg (for example, 3V).

In this example, the nonvolatile memory device MC21 of the memory pair MP2 in the cell unit CELL1 is a selected memory cell (transistor).

Both of the gate terminals of the nonvolatile memory devices MC21, MC22 are at Vg_prg, but only the nonvolatile memory device MC21 connected to the data line BL1, to which Vd_prg is applied, is written, and the threshold value thereof increases. The threshold value of the nonvolatile memory device MC22 does not increase, or increases less greatly as compared with the amount of increment of the threshold value of the nonvolatile memory device MC21.

This is because channel pinchoff occurs in the channel of the nonvolatile memory device MC21, and hot electrons are generated only in the channel of the nonvolatile memory device MC21.

(Erase)

Figure 28:
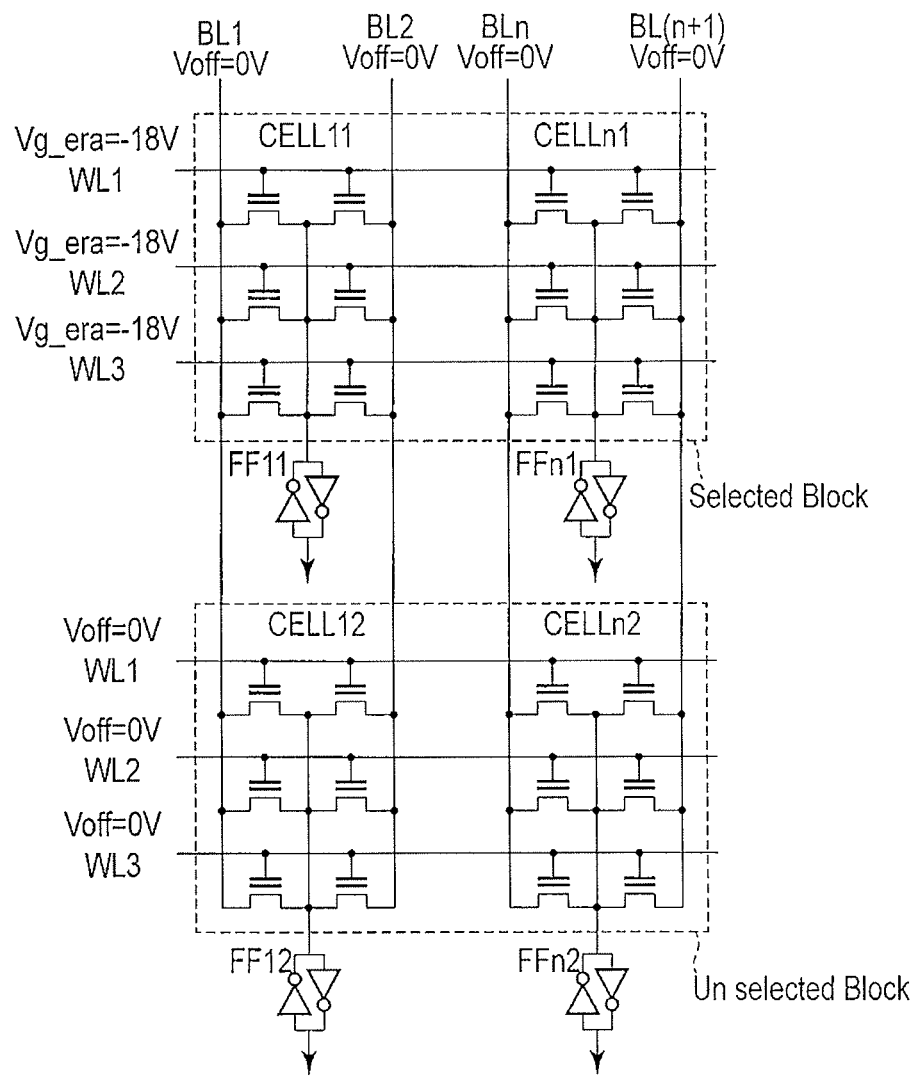
FIG. 28 is a figure illustrating a memory array during erase operation.

FIG. 28 illustrates potential relationship of the memory of FIG. 25 during erase operation.

The erase operation for the NOR type is the same as the erase operation of the NAND type.

The erase operation of the NAND type (the erase operation of the basic unit) has already been explained. Therefore, detailed description thereabout is omitted here.

CONCLUSION

According to the embodiments, a nonvolatile configuration memory which can prevent read disturb and which has a small area size can be achieved.

In the explanation about the above basic unit (embodiment) and the modification thereof, for example, two nonvolatile memory devices in the memory pair store complementary data "0"/"1". Alternatively, one of the two nonvolatile memory devices may always store the "0" state having the high threshold value (high-Vth), and the other of the two nonvolatile memory devices may selectively store either the "1" state of the low threshold value (low-Vth) or the "0" state of the high threshold value (high-Vth) in accordance with the value of the configuration data.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A configuration memory comprising:
   first and second data lines;
   a first memory string which comprises at least first and second nonvolatile memory transistors which are connected in series between a common node and the first data line;
   a second memory string which comprises at least third and fourth nonvolatile memory transistors which are connected in series between the common node and the second data line;
   a first control line connected to gate terminals of the first and third nonvolatile memory transistors;
   a second control line connected to gate terminals of the second and fourth nonvolatile memory transistors; and
   a flip-flop circuit which comprises a first data holding node connected to the common node and a second data holding node connected to a configuration data output node.

2. The memory of claim 1, further comprising a driver which is configured to:
   set a threshold value of the first nonvolatile memory transistor to a value higher than a threshold value of the third nonvolatile memory transistor, in order to store configuration data with one bit as a first value in the first and third nonvolatile memory transistors, and
   set the threshold value of the third nonvolatile memory transistor to a value higher than the threshold value of the first nonvolatile memory transistor, in order to store configuration data with one bit as a second value in the first and third nonvolatile memory transistors.

3. The memory of claim 2, further comprising a driver which is configured to:
   apply a first potential to the first data line, apply a second potential to the second data line, and apply a read potential between threshold values of the first and third nonvolatile memory transistors to gate terminals of the first and third nonvolatile memory transistors, in order to transfer a selected context based on the configuration data to the flip-flop circuit.

4. The memory of claim 1, further comprising an inverse configuration data output node which is connected to the common node, and which outputs data obtained by inverting data which are output from the configuration data output node.

5. The memory of claim 1, further comprising:
a global power supply line to which a power supply potential is applied;
a local power supply line; and
a power switch which is connected between the global power supply line and the local power supply line,
wherein the flip-flop circuit comprises first and second inverters which are connected in a cross-coupled manner, and
each of the first and second inverters comprises a P-channel type FET of which source terminal is connected to the local power supply line.

6. The memory of claim 1, further comprising:
a global ground line to which a ground potential is applied;
a local ground line; and
a ground switch which is connected between the global ground line and the local ground line,
wherein the flip-flop circuit comprises first and second inverters which are connected in a cross-coupled manner, and
each of the first and second inverters comprises an N-channel type FET of which source terminal is connected to the local ground line.

7. The memory of claim 1, further comprising:
a global power supply line to which a power supply potential is applied;
a local power supply line;
a power switch which is connected between the global power supply line and the local power supply line;
a global ground line to which a ground potential is applied;
a local ground line;
a ground switch which is connected between the global ground line and the local ground line; and
an equalize switch which is connected between the local power supply line and the local ground line and which is controlled by a control signal.

8. The memory of claim 7, wherein the equalize switch comprises an N-channel type FET and a P-channel type FET which are arranged in parallel between the local power supply line and the local ground line.

9. The memory of claim 1, further comprising:
an equalize switch which is connected between the common node and the configuration data output node and which is controlled by a control signal.

10. The memory of claim 1, wherein the first and second memory strings are formed on one active area.

11. The memory of claim 1, further comprising:
a precharge power supply line to which a precharge potential is applied;
a first precharge switch which is connected between the precharge power supply line and the common node;
a second precharge switch which is connected between the precharge power supply line and the configuration data output node; and
an equalize switch connected between the common node and the configuration data output node,
wherein the first precharge switch, the second precharge switch, and the equalize switch are controlled by the control signal.

12. The memory of claim 1, further comprising:
a precharge power supply line to which a precharge potential is applied; and
a precharge switch which is connected between the precharge power supply line and the configuration data output node, and which is controlled by a control signal.

13. A configuration memory comprising:
first and second data lines;
first and second control lines;
a first memory pair which comprises a first nonvolatile memory transistor of which gate terminal is connected to the first control line, of which drain terminal is connected to the first data line, and of which source terminal is connected to a common node, and a second nonvolatile memory transistor of which gate terminal is connected to the first control line, of which drain terminal is connected to the second data line, and of which source terminal is connected to the common node;
a second memory pair which comprises a third nonvolatile memory transistor of which gate terminal is connected to the second control line, of which drain terminal is connected to the first data line, and of which source terminal is connected to the common node, and a fourth nonvolatile memory transistor of which gate terminal is connected to the second control line, of which drain terminal is connected to the second data line, and of which source terminal is connected to the common node; and
a flip-flop circuit which comprises a first data holding node connected to the common node and a second data holding node connected to a configuration data output node.

14. The memory of claim 13,
wherein a selected context based on the one bit of configuration data stored in the first and second nonvolatile memory transistors is transferred to the flip-flop circuit.

15. The memory of claim 13, further comprising:
a global power supply line to which a power supply potential is applied;
a local power supply line;
a power switch which is connected between the global power supply line and the local power supply line,
a global ground line to which a ground potential is applied;
a local ground line;
a ground switch which is connected between the global ground line and the local ground line; and
an equalize switch which is connected between the local power supply line and the local ground line and which is controlled by a control signal.

16. The memory of claim 15, wherein the equalize switch comprises an N-channel type FET and a P-channel type FET which are arranged in parallel between the local power supply line and the local ground line.

17. A configuration memory array comprising:
first and second configuration memories,
wherein the first configuration memory comprises:
first and second data lines;
a first memory string which comprises at least first and second nonvolatile memory transistors which are connected in series between a first common node and the first data line;
a second memory string which comprises at least third and fourth nonvolatile memory transistors which are connected in series between the first common node and the second data line; and
a first flip-flop circuit which comprises a first data holding node connected to the first common node and a second data holding node connected to a first configuration data output node,
wherein the second configuration memory comprises:
third and fourth data lines;

a third memory string which comprises at least fifth and sixth nonvolatile memory transistors which are connected in series between a second common node and the third data line;

a fourth memory string which comprises at least seventh and eighth nonvolatile memory transistors which are connected in series between the second common node and the fourth data line; and a second flip-flop circuit which comprises a third data holding node connected to the second common node and a fourth data holding node connected to a second configuration data output node, wherein the first, second, third, and fourth memory strings are arranged in a first direction with a first pitch on average, and extend in a second direction which is perpendicular to the first direction, the first common node is a first via, the second common node is a second via, the first via and the second via are arranged in the first direction with a second pitch on average, the second pitch is twice the first pitch, and both of the first and second flip-flop circuits are arranged within a range of a third pitch, which is twice the second pitch, in the first direction.

18. A configuration memory comprising:

first and second data lines;

a first memory string which comprises at least first and second nonvolatile memory transistors which are connected in series between a common node and the first data line;

a second memory string which comprises at least third and fourth nonvolatile memory transistors which are connected in series between the common node and the second data line;

an N-channel type FET of which gate terminal is connected to the common node, of which source terminal is connected to a ground node, and of which drain terminal is connected to a configuration data input node;

a flip-flop circuit connected between the configuration data input node and a configuration data output node; and a P-channel type FET, wherein a control signal is input to a gate terminal of the P-channel type FET, a source terminal of the P-channel type FET is connected to a power supply node, and a drain terminal of the P-channel type FET is connected to the configuration data input node.

19. A configuration memory comprising:

first and second data lines;

a first memory string which comprises at least first and second nonvolatile memory transistors which are connected in series between a common node and the first data line;

a second memory string which comprises at least third and fourth nonvolatile memory transistors which are connected in series between the common node and the second data line;

an inverter of which input terminal is connected to the common node;

a transfer gate which is connected between a configuration data input node and an output terminal of the inverter; and a flip-flop circuit connected between the configuration data input node and a configuration data output node.

* * * * *